(12) United States Patent
Burn et al.

(10) Patent No.: US 7,960,557 B2
(45) Date of Patent: *Jun. 14, 2011

(54) ASYMMETRIC DENDRIMERS

(75) Inventors: Paul Leslie Burn, Oxford (GB); Ifor David William Samuel, Fife (GB); Shih-Chun Lo, Oxford (GB)

(73) Assignees: Isis Innovation Limited, Oxford (GB); The University Court of the University of St. Andrews, Fife (GB)

( * ) Notice: Subject to any disclaimer, the term of this patent is extended or adjusted under 35 U.S.C. 154(b) by 0 days.

This patent is subject to a terminal disclaimer.

(21) Appl. No.: 12/472,176

(22) Filed: May 26, 2009

(65) Prior Publication Data

US 2009/0326238 A1 Dec. 31, 2009

Related U.S. Application Data

(63) Continuation of application No. 10/468,863, filed as application No. PCT/GB02/00765 on Feb. 20, 2002, now Pat. No. 7,537,842.

(30) Foreign Application Priority Data

Feb. 20, 2001 (GB) .................................. 0104176.3

(51) Int. Cl.
C07D 413/10 (2006.01)
C07C 43/205 (2006.01)
(52) U.S. Cl. ........................................ 548/145; 568/643
(58) Field of Classification Search ........................ None
See application file for complete search history.

(56) References Cited

U.S. PATENT DOCUMENTS

| 5,041,516 | A | 8/1991 | Frechet et al. | 528/44 |
|---|---|---|---|---|
| 5,150,006 | A | 9/1992 | Van Slyke et al. | 313/504 |
| 5,432,014 | A | 7/1995 | Sano et al. | 428/690 |
| 5,972,247 | A | 10/1999 | Shi et al. | 252/583 |
| 6,083,634 | A | 7/2000 | Shi | 428/690 |
| 6,558,818 | B1 * | 5/2003 | Samuel et al. | 428/690 |
| 6,632,543 | B1 | 10/2003 | Kawamura | 428/690 |
| 7,537,842 | B2 * | 5/2009 | Burn et al. | 428/690 |
| 2003/0165716 | A1 | 9/2003 | Samuel et al. | 428/690 |
| 2005/0116622 | A1 | 6/2005 | Lo et al. | 313/504 |
| 2005/0164029 | A1 | 7/2005 | Burn et al. | 428/690 |

FOREIGN PATENT DOCUMENTS

| EP | 1 009 041 | 6/2000 |
|---|---|---|
| EP | 1 009 042 | 6/2000 |
| EP | 1 009 043 | 6/2000 |
| EP | 1 009 044 | 6/2000 |
| JP | 1-105955 | 4/1989 |

(Continued)

OTHER PUBLICATIONS

Adachi et al., "High-efficiency Organic Electrophosphorescent Devices with tris(2-phenylpryridine)iridium Doped into Electron-Transporting Materials," Appl. Phys. Lett.

(Continued)

*Primary Examiner* — D. Lawrence Tarazano
*Assistant Examiner* — Camie S Thompson
(74) *Attorney, Agent, or Firm* — Marshall, Gerstein & Borun LLP

(57) ABSTRACT

Asymmetric light-emitting dendrimers having the formulae: (a) CORE-[DENDRITE1]n[DENDRITE2]m and (b) CORE-[DENDRITE]n are disclosed.

22 Claims, 14 Drawing Sheets

FOREIGN PATENT DOCUMENTS

| | | |
|---|---|---|
| JP | 1-279240 | 11/1989 |
| JP | 8-012967 | 1/1996 |
| JP | 9-241265 | 9/1997 |
| WO | 99/21935 | 5/1999 |
| WO | 01/23344 | 4/2001 |
| WO | 01/59030 | 8/2001 |

OTHER PUBLICATIONS

Adronov et al., "Light-Harvesting Dendrimers," Chem. Commun. 1701-1710 (2000).
Armaroli et al., "A Copper(I) Bis-Phenanthroline Complex Buried in Fullerene-Functionalized Dendritic Black Boxes," Angew. Chem. Int. Ed. 38(24):3730-3733.
Baldo et al., "High-efficiency Fluorsecent Organic Light-emitting Devices using a Phosphorescent Sensitizer," Nature, 403:750-753 (2000).
Balzani et al., Coord. Chem. Rev., 132:1-13 (1994).
Balzani et al., Solar Energy Materials and Solar Cells, 38:159-173 (1995).
Beaupre et al., "Synthesis and Characterization of a Novel Polyester Derived from Substituted Terfluorene," Macromol. Rapid Commun. 21:1013-1018 (2000).
Bettenhausen et al., "Dendrimers With 1,3,4-Oxadiazole Units, 1," Macromol. Rapid Commun. 17: 623-631 (1996).
Bhyrappa et al., "Dendrimer-Metalloporphyrins: Synthesis and Catalysis," J. Am. Chem. Soc. 118: 5708-5711 (1996).
Burn et al., "Chemical Tuning of the Electronic Properties of Poly(p-phenylenevinylene)—Based Copolymers," J. Am. Chem. Soc. 115:10117-10124 (1993).
Chan et al., "Light-Emitting Multifunctional Rhenium (I) and Ruthenium (II) 2,2'-bipyridyl Complexes with Bipolar Character," Applied Physics Letters, 75(25):3920-3922 (1999).
Chen et al., "Recent Developments in Molecular Organic Electroluminescent Materials," Macromolecular Symposia, 125:1-48 (1998).
Deb et al., "A Simple Orthogonal Approach to Poly(phenylenevinylene) Dendrimers," J. Am. Chem. Soc., 119:9079-9080 (1997).
Devadoss et al., "Energy Transfer in Dendritic Macromolecules: Molecular Size Effects and the Role of an Energy Gradient," J. Am. Chem. Soc. 118:9635-9644 (1996).
Djurovich et al., "Ir(III) Cyclometalated Complexes as Efficient Phosphorescent Emiiters in Polymer Blend and Organic LEDs " Polymer Reprints 41:770-771 (2000).
Examination Report for Application No. 02700448.0/1235, dated Aug. 30, 2007.
Examination Report for Application No. 02700448.0/1235, dated Nov. 20, 2007.
Fischer et al., "Dendrimers: From Design to Application—A Progress Report," Angew. Chem. Int. Ed. 38:884-905 (1999).
Freeman et al., "Dendrimer-Containing Light-Emitting Diodes: Toward Site-Isolation of Chromophores," J. Am. Chem. Soc. 122:12385-12386 (2000).
Gong et al., "Trifunctional Light-Emitting Molecules Based on Rhenium and Ruthenium Bipyridine Complexes." Adv. Mater., 10(16):1337-1340 (1998).
Gorman, "Metallodendrimers: Structural Diversity and Functional Behavior," Adv. Mater., 10(4):295-309 (1998).
Gutierrez et al., "Cyclometallation Palladium 2-Arylpyridine Complexes," J. Organomet. Chem., 202:341-350 (1980).
Halim et al., "Conjugated Dendrimers for Light-Emitting Diodes: Effect of Generation," Adv. Mater. 11(5):371-374 (1999).
Huang et al., "Design and Synthesis of Electroluminescent Europium Complexes Containing Dendron Substituted Diketone Ligands," Physical Organic, Photochemistry, Materials.
Issberner et al., "Dendrimers: From Generations and Functional Groups to Functions," Angew, Chem. Int. Ed. Engl., 33(23/24):2413-2420 (1994).
Jandke et al., "Phenylquinoxaline Polymers and Low Molar Mass Glasses as Electron-Transport Materials in Organic Light-Emitting Diodes," Macromolecules, 31:6434-6443.

Kawa et al., "Enhanced Luminescence of Lanthanide within Lanthanide-Cored Dendrimer Complexes," Thin Solid Films, 331(1-2):259-263 (1998).
Kelley et al., "The Synthesis of Bridged Oligophenylenes from Fluorene 1. Terphenyls and Quaterphenyls," J. Chem. Research (M), 2701-2709 (1997).
Kimura et al., "Energy Transfer within Ruthenium-Cored Rigid Metallodendrimers," Tetrahedron Letters, 41:6809-6813 (2000).
Kraft, "Self-Association of a 1,3,4-Oxadiazole-Containing Dendrimer," Chem. Commun., 77-79 (1996).
Kwok et al., "Synthesis and Light-Emitting Properties of Difunctional Dendritic Distyrylstilbenes," Macromolecules 2001.
Li et al., "Design, Synthesis, and Photodynamics of Light-Harvesting Arrays Comprised of a Porphyrin and One, Two, or Eight Boron-Dipyrrin Accessory Pigments," J. Am. Chem.
Lupton et al., "Control of Electrophosphorescence in Conjugated Dendrimer Light-Emitting Diodes," Adv. Funct. Mater., 11(4):287-294 (2001).
Miller et al., "Synthesis and Characterization of A Series of Monodisperse, 1,3,5-Phenylene-Based Hydrocarbon Dendrimers Including C276H186 and Their Fluorinated Analogues,".
Murfee et al., "New Metallodendrimers Containing an Octakis(diphenylphosphino)—Functionalized Silsesquioxane Core and Ruthenium(II)-Based Chromophores," Inorg.
Murfee et al., "New Starburst Metallodendrimers Based on Octa(Diphenylphosphino)—Functionalized Silsesquioxane Cores," Am. Chem. Soc. Div. Polym. Chem. 41(1):431.
Newkome et al., "Nanometric Dendritic Macromolecules: Stepwise Assembly by Double (2,2':6,2"—terpyridine)ruthenium(I) Connectivity," J. Mater. Chem. 7(7):1237-1244.
Nunez et al., "Dendritic Macromolecules for Light-Energy Conservation," Book of Abstracts, 215th ACS National Meeting, Dallas, Mar. 29-Apr. 2 (1998).
Palmans et al., Tensile Orientation Behavior of Alkoxy-Substituted Bis(phenylethynyl)benzene Derivatives in Polyolefin Blend Films,: Chem. Mater.
Phelan et al., "Synthesis of Luminescent Materials Containing Rare Earth Cored Dendritic β-diketones," Sci-Mix Symposium (2001).
Pilow et al., "Synthetic Routes to Phenylene Vinylene Dendrimers," Synthetic Metals 102:1468-1469 (1999).
Plevoets et al., "Supramolecular Dendrimers with a [Ru(bpy)3]2+ Core and Naphthyl Peripheral Units," New J. Chem. 23(1):63-69 (1999).
Ranger et al., "New Well-Defined Poly(2,7-fluorene) Derivatives: Photoluminescence and Base Doping," Macromolecules, 30:7686-7691 (1997).
Sakamoto et al., "Synthesis, Characterization, and Electron-Transport Property of Perfluorinated Phenylene Dendrimers," J. Am. Chem. Soc. 122:1832-1833 (2000).
Serroni et al., Polynuclear Metal Complexes of Nanometre Size. A Versatile Synthetic Strategy Leading to Luminescent and Redox-Active Dendrimers Made of an Osmium(II).
Setayesh et al., "Polyfluorenes with Polyphenylene Dendron Side Chains: Toward Non-Aggregating. Light-Emitting Polymers," Journal of the American Chemical Society.
Suslick et al., "Regioselective Epoxidations of Dienes with Manganese(III) Porphyrin Catalysts," J. Chem. Soc., Chem. Commun., 200-202 (1987).
van der Sluis et al., Synthesis of Novel Phosphaalkene-Based Bidentate Ligands Mes*P=CH(3-R-Ar) (R=Pyridyl, Carbaldimino) and Formation of Three-Membered.
Venturi et al., "Electrochemical and Photochemical Properties of Metal-Containing Dendrimers," Topics in Current Chemistry, 197:193-228 (1998).
Vogtle et al., Dendrimers with a Photoactive and Redox-Active [Ru(bpy)3]2+—Type Core: Photophysical Properties, Electrochemical Behavior, and Excited-State Electron-Transfer.
Volz et al., "meso-Substituierte Porphyrine, 5[1] Korbporphyrine," Institut für Organische Chemie der Universität Karlsruhe, Z. Naturforsch., 43b:1043-1052 (1998).
Wang et al., "Electroluminescent Diodes from a Single-Component Emitting Layer of Dendritic Macromolecules," Advanced Materials, 8:193-241 (1996).

Wiesler et al., "Divergent Synthesis of Polyphenylene Dendrimers: The Role of Core and Branching Reagents Upon Size and Shape," Macromolecules 34:187-199 (2001).

Yang et al., "Use of Poly(9-vinylcarbazole) as Host Material for Iridium Complexes in High-efficiency Organic Light-emitting Devices," Jpn. J. Appl. Phys., 30:L828-L829 (2000).

International Preliminary Examination Report in PCT/GB02/00765, dated Apr. 24, 2001.

International Search Report in PCT/GB02/00765, dated Apr. 18, 2002.

Search Report in GB 0104176.3, dated Aug. 28, 2001.

* cited by examiner

ASYMMETRIC DENDRIMERS

CROSS-REFERENCE TO RELATED APPLICATIONS

This is a continuation of U.S. patent application Ser. No. 10/468,863 filed Jan. 5, 2004 (now U.S. Pat. No. 7,537,842), which is the U.S. national phase of International Application No. PCT/GB02/00765 filed Feb. 20, 2002, the entire disclosures of which are hereby incorporated by reference.

This invention relates to asymmetric dendrimers and light emitting devices containing them.

Light-emitting materials fall into three classes, namely molecular, polymeric, and dendritic. Dendritic materials have several advantages over molecular and polymeric materials including: a) the electronic properties can be changed without altering the processing properties; b) a greater variety of chromophores can be used as the dendritic architecture can stop π-π stacking of the chromophores; c) the efficiency of light-emitting diodes can be controlled by the dendrimer generation i.e. the number of sets of branching points within a dendron (also called dendrite); and d) the dendrimer architecture makes the formation of blends with other dendrimers, polymers and molecular materials simple. Dendrimers consist of dendrons or dendritic structures terminating in surface groups and a core (see FIG. 1). Dendrons have at least one, and preferably more than one, branching point. The branching points are atoms or groups to which at least two linkers or branches are attached. The nature of the branching points and the links between the branching points can be varied. A branching group can be directly connected to the next branching group (e.g. aryl-aryl), or there can be linking groups in between (e.g. aryl-vinyl-aryl). There are at least three attachments in total to a branching group, but only two are needed to a linker group. These can be illustrated as follows:

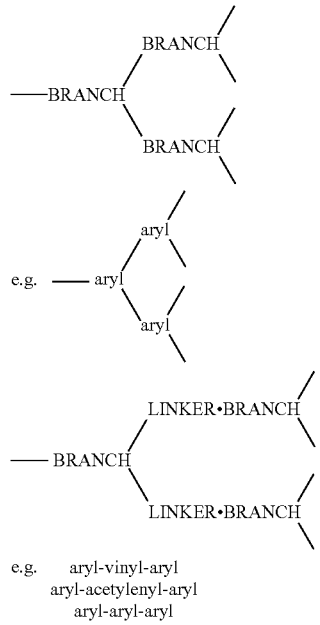

As used herein, the term acetylenyl refers to acetylenyl groups that are di-valent, vinyl refers to vinyl groups that are di- or tri-valent and aryl refers to aryl groups that are di-, tri- or multivalent.

There have been a number of classes of light-emitting dendrimers reported with the main differences observed in the dendron architecture. The first report of a light-emitting dendrimer had a fluorescent core and phenylacetylene based dendrons. More recently a superior system has been reported where the dendrimers are again comprised of a fluorescent core but the dendrons contain stilbene moieties. Dendrimers based on this latter architecture have been shown to have the advantages described above over molecular and polymeric materials. Some simple dendrimers that contain biphenyl based dendrons have also been described. Finally, there have been a few reports of dendrimers that contain luminescent chromophores but where the dendrons contain non-conjugated branching points. These latter materials have the potential disadvantage that much of it is comprised of electrically insulating groups. The dendrimer types that are likely to have the greatest promise are those that contain mostly conjugated dendrons. These include those described in WO99/21935; these are compounds having the formula:

in which CORE represents an atom or group, n represents an integer of at least 1 and DENDRITE, which may the same or different if n is greater than 1, represents an inherently at least partly conjugated dendritic structure comprising aryl and/or heteroaryl groups and alkenyl groups connected to each other via a carbon atom of an alkenyl group to a ring carbon atom of an aryl or heteroaryl group, CORE terminating in the first single bond which is connected to a ring carbon atom of an (hetero)aryl group to which more than one at least partly conjugated dendritic branch is attached (i.e. a branching point), said ring carbon atom forming part of DENDRITE, the CORE and/or DENDRITE being luminescent.

In inherently at least partially conjugated dendrons suitable branching groups include aryl and heteroaryl where the definition of (hetero)aryl includes aromatic fused ring systems such as naphthalene and fluorene. Suitable linking groups between the branching groups include (hetero)aryl as well as vinyl and acetylenyl groups. In a conjugated system the linking groups are attached to the branching groups by an sp² or sp hybridized carbon atom. Hence suitable links between branching groups for at least partially conjugated dendrons include aryl-aryl, aryl-vinyl-aryl, aryl-acetylenyl-aryl, and aryl-aryl'-aryl (where aryl' may be different from aryl). It is also possible for there to be more than one linking group between branching points so combinations such as aryl-vinyl-acetylenyl-aryl, aryl-aryl'-vinyl-aryl or aryl-aryl'-acetylenyl-aryl are also suitable.

Thus in inherently at least partially conjugated dendrimers the core terminates at the single bond to the first branching group, i.e. a bond to the ring carbon (sp² carbon) of a (hetero) aryl branching group, the ring carbon forming part of the dendron. However, it has now been appreciated, according to the present invention, that having the same linking group between the branching points in the dendrons in the dendrimer is not necessarily advantageous. For example, an aryl-vinyl-aryl link may be advantageous for hole transport in an LED (light emitting diode) but for electron transport an aryl-aryl'-aryl linkage such as in a phenyl-oxadiazole-phenyl dendron could have superior properties. Accordingly the present invention provides (a) a light emitting dendrimer having the formula:

in which CORE represents an atom or group, n and m, which may be the same or different, each represent an integer of at least 1, each DENDRITE¹, which may be the same or different when n is greater than 1, and each DENDRITE², which may be the same or different when m is greater than 1, represent dendritic structures, at least one of said structures being fully conjugated and comprising aryl and/or heteroaryl groups and, optionally, vinyl and/or acetylenyl groups, connected via $sp^2$ or sp hybridized carbon atoms of said (hetero) aryl, vinyl and acetylenyl groups, and at least one branching point and/or link between branching points in DENDRITE¹ being different from those in DENDRITE², CORE terminating in the single bond which is connected to a $sp^2$ hybridized (ring) carbon atom of the first (hetero)aryl group to which more than one conjugated dendritic branch is attached, said ring carbon atom forming part of said fully conjugated DENDRITE¹ or DENDRITE² and CORE terminating at the single bond to the first branching point for the other of said DENDRITE¹ or DENDRITE², at least one of the CORE, DENDRITE¹ and DENDRITE² being luminescent, as well as (b) a light emitting dendrimer having the formula:

CORE-[DENDRITE]$_n$ in which CORE represents an atom or group, n represents an integer of at least 1, each DENDRITE, which may be the same or different, represents an inherently at least partially conjugated dendritic molecular structure which comprises aryl and/or heteroaryl and, optionally, vinyl and/or acetylenyl groups connected via $sp^2$ or sp hybridized carbon atoms of said (hetero) aryl, vinyl and acetylenyl groups, and wherein the links between at least one pair of adjacent branching points in said DENDRITE are different such that if two links are to be regarded as different then one said link must comprise at least one aryl, heteroaryl, vinyl or acetylenyl group which is not present in the other of the said two links, CORE terminating in the single bond which is connected to a $sp^2$ hybridized (ring) carbon atom of the first (hetero)aryl group to which more than one dendritic branch is attached, said ring carbon atom forming part of said DENDRITE, the CORE and/or DENDRITE being luminescent. In a preferred embodiment n is greater than 1. Thus the present invention provides, inter alia, dendrimers of Types 1 to 4 as shown in FIG. 2.

Thus in Type 1 there are aryl-aryl or, more generally, aryl-(aryl')$_a$-aryl, wherein aryl includes heteroaryl and aryl'is the same as or different from aryl and a is an integer from 0 to 3, and aryl-vinyl-aryl linkages (or, more generally, aryl-(vinyl) x-[aryl'v-(vinyl)y]z-aryl where x is an integer from 1 to 3, preferably 1 or 2, y is an integer from 0 to 3, preferably 0, 1 or 2, v and z are independently from 0 to 3 (where the aryl groups are branching points), in Type 2 aryl-(aryl')a-aryl and aryl-acetylenyl-aryl linkages (or, more generally, aryl-(acetylenyl)d-[(aryl')e-(acetylenyl)f]g-aryl where d is an integer from 1 to 3, preferably 1 or 2, f is an integer from 0 to 3, preferably 0, 1 or 2, and e and g are independently 0 to 3), in Type 3 aryl-vinyl-aryl and aryl-acetylenyl-aryl linkages (or their more general variants) and in Type 4 there are dendrons containing more than one type of link in each dendron, i.e. aryl-aryl and either aryl-vinyl-aryl or aryl-acetylenyl-aryl (or their more general variants). It is to be understood that references to aryl (and aryl') include heteroaryl and fused aromatic ring systems. Thus the dendrimers contain two or more of the following types of linkages between branching points within the dendrites: aryl-aryl, aryl-vinyl-aryl, aryl-acetylenyl-aryl and aryl-vinyl-acetylenyl-aryl. In the last three cases the number of vinyl and acetylenyl linkages can be 1 or more and in Type 4 the number and order of the different units, in this case vinyl and acetylenyl units, can be varied. In addition, one dendron can contain more than one type of link between the branch points. For example, a single dendron may contain a mixture of aryl-aryl links and aryl-vinyl-aryl links. It is to be appreciated that although in these units aryl acts as the branching points, aryl can also be a linking group.

It will be appreciated that in Types 1 to 3 DENDRITE¹ differs from DENDRITE² by having different branching points and/or different links (because differences in surface groups and/or generation, although they can be present, are regarded as insignificant for the purposes of deciding whether or not the dendritic structures are "different"); in this regard the branching points and/or links of one of DENDRITE¹ and DENDRITE² are regarded as different from the branching points and/or links of the other of DENDRITE¹ and DENDRITE² if the aryl group or groups in the first one are not all the same as the group or groups of the second one. Thus a dendrite with a phenyl-phenyl structure is regarded as different from a dendrite with a phenyl-pyridyl structure. Preferably if DENDRITE¹ differs from DENDRITE² merely in a different link then, for two links to be regarded as different one said link must comprise at least one aryl, heteroaryl, vinyl or acetylenyl group which is not present in the other of said two links. Of course such differences can also be present in Type 4 dendrimers. Indeed for Type 4 dendrimers a difference merely in the number of vinyl or acetylenyl groups as links should not be regarded as a difference.

In this context, conjugated dendrons (dendrites) indicate that they are made up of alternating double and single bonds, apart from the surface groups. However this does not mean that the π system is fully delocalised. The delocalisation of the π system is dependent on the regiochemistry of the attachments.

The dendrimer may have more than one luminescent moiety and the energy resulting from electrical or optical excitation may be transferred to one of them for light emission. In a preferred embodiment the dendrimer incorporates at least two inherently at least partially-conjugated luminescent moieties which moieties may or may not be conjugated with each other, wherein the dendron includes at least one of the said luminescent moieties. Preferably the luminescent moiety or moieties further from the core of the dendrimer generally have a larger HOMO-LUMO energy gap than the luminescent moiety or moieties closer to or partly or wholly within the core of the dendrimer. In another embodiment the HOMO-LUMO energy gap on the dendrite is substantially the same although the surface groups may change the HOMO-LUMO energy gap of the chromophores at the surface of the dendrimer. Sometimes in, say, the second generation dendrimer the surface group makes the chromophore at the distal end of the dendrite of lower HOMO-LUMO energy compared to that of the next one in.

The relative HOMO-LUMO energy gaps of the moieties can be measured by methods known per se using a UV-visible spectrophotometer. One of the luminescent moieties may be, or (partly or wholly) within, the core itself, which will thus preferably have a smaller inherent HOMO-LUMO energy gap than the other luminescent moiety or moieties in the dendron. Alternatively, or in addition, the dendrons themselves may each contain more than one luminescent moiety, in which case those further from the core will again preferably have larger inherent HOMO-LUMO energy gap than those closer to the core. In this case, the core itself need not be luminescent, although luminescent cores are generally preferred.

In a preferred embodiment the dendrimer of the invention is a dendrimer which is luminescent in the solid state. In a preferred embodiment the dendrimer of the invention comprises a luminescent core. In a preferred embodiment of the dendrimer of the invention at least one component of the dendrons is luminescent.

In a preferred embodiment of the dendrimer of the invention the HOMO-LUMO energy gap of the core is lower than that of the conjugated moieties in the dendrons. In a preferred embodiment of the dendrimer of the invention the HOMO-LUMO energy gap of the moieties in the dendrite generally decreases from the surface to the point of attachment to the core.

The surface groups in a dendrimer of the invention may be the same or different. Likewise, the surface groups within a given dendron of a dendrimer of the invention may be the same or different.

Suitable surface groups for the dendrimers include branched and unbranched alkyl (especially t-butyl), branched and unbranched alkoxy, hydroxy, alkylsilane, carboxy, carbalkoxy, and vinyl. A more comprehensive list includes a further-reactable alkene, (meth)acrylate, sulphur-containing, or silicon-containing group; a sulphonyl group; a polyether group; a $C_1$-to-$C_{15}$ alkyl (preferably t-butyl) group; an amine group; a mono-, di- or tri-$C_1$-to-$C_{15}$ alkyl amine group; a —COOR group wherein R is hydrogen or $C_1$-to-$C_{15}$ alkyl; an —OR group wherein R is hydrogen, aryl, or a $C_1$-to-$C_{15}$ alkyl or alkenyl; an —$O_2$SR group wherein R is $C_1$-to-$C_{15}$ alkyl or alkenyl; an —SR group wherein R is aryl, or $C_1$-to-$C_{15}$ alkyl or alkenyl; an —$SiR_3$ group wherein the R groups are the same or different and are hydrogen, $C_1$-to-$C_{15}$ alkyl or alkenyl, or an —SR= group (R= is aryl or $C_1$-to-$C_{15}$ alkyl or alkenyl), aryl, or heteroaryl. Typically t-butyl and alkoxy groups are used. Different surface groups may be present on different dendrons.

It is preferred that the dendrimer is solution-processable i.e. the surface groups are such that the dendrimer can be dissolved in a solvent. The surface group can be chosen such that the dendrimer can be photopatterned. For example, a cross-linkable group is present which can be cross-linked upon irradiation or by chemical reaction. Alternatively the surface group comprises a protecting group which can be removed to leave a group which can be cross-linked. In general, the surface groups are selected so the dendrimers are soluble in solvents suitable for solution processing.

The aryl (and aryl') groups within the dendrons can be typically benzene, naphthalene, anthracene, fluorene, pyridine, oxadiazole, triazole, triazine, thiophene and where appropriate substituted variations. These groups may optionally be substituted, typically by $C_1$ to $C_{15}$ alkyl or alkoxy groups. The aryl groups at the branching points are preferably benzene rings, preferably coupled at ring positions 1, 3 and 5, pyridyl or triazinyl rings. The dendrons themselves can contain a, or the, fluorescent chromophore.

The cores can be comprised of luminescent or non-luminescent moieties. In the latter case the dendrons must contain luminescent groups. In the case of the cores being luminescent they can be comprised of either organic and/or organometallic fluorophores and/or phosphors. Typical cores include one or more moieties of benzene, pyridine, pyrimidine, triazine, thiophene, fluorene, divinylbenzene, distyrylethylene, divinylpyridine, pyrimidine, triazine, divinylthiophene, oxadiazole, coronene, or a fluorescent dye or marker compound or an organometallic complex such as a lanthanide, or iridium complex, or a platinum porphyrin, or a distyryl anthracene, porphyrin or distyrylbenzene moiety. These various rings may be substituted, for example by $C_1$ to $C_{15}$ alkyl or alkoxy groups.

It is possible to control the electron affinity of the dendrimers by the addition to the chromophores of electron-withdrawing groups where appropriate, for example cyano and sulfone which are strongly electron-withdrawing and optically transparent in the spectral region we are interested in. Further details of this and other modifications of the dendrimers can be found in WO99/21935 to which reference should be made.

It will be appreciated that one or more of the dendrons attached to the core (provided that at least one dendron is a specified conjugated dendron) can be unconjugated. Typically such dendrons include ether-type aryl dendrons, for example where benzene rings are attached via a methyleneoxy link.

The dendrimers for the present invention can be prepared in a similar manner to those described in WO99/21935. In a preferred embodiment, the dendrons are first prepared and then the dendrons are reacted to form the dendrimer. In the case of Types 1 to 3 this will involve the preparation of 2 to 3 dendrons whereas in Type 4 only one type of dendron may need to be prepared. The dendrons are then reacted with a functionality to form the core.

The dendrimer can be incorporated into a light-emitting device such as a light-emitting diode (LED), also known as an electroluminescent (EL) device, in a conventional manner. In a preferred embodiment the dendrimer acts as the light emitting element. By suitable selection of dendrons and surface groups the dendrimers can be made soluble in conventional solvents such as toluene, THF, water and alcoholic solvents such as methanol. In its simplest form, an organic light emitting or electroluminescent device can be formed from a light emitting layer sandwiched between two electrodes, at least one of which must be transparent to the emitted light. Such a device can have a conventional arrangement comprising a transparent substrate layer, a transparent electrode layer, a light emitting layer and a back electrode. For this purpose the standard materials, can be used. Thus, typically, the transparent substrate layer is made of glass although other transparent materials, for example PET, can also be used.

The anode, which is generally transparent, is preferably made from indium tin oxide (ITO) although other similar materials including indium oxide/tin oxide, tin oxide/antimony, zinc oxide/aluminum, gold and platinum can also be used. Conducting polymers such as PANI (polyaniline) or PEDOT (poly(3,4-ethylenedioxythiophene) can also be used.

The cathode is normally made of a low work function metal or alloy such as Al, Ca, Mg, Li, or MgAg or optionally with an additional layer of LiF. As is well known, other layers may also be present, including a hole transporting material and/or an electron transporting material. In an alternative configuration, the substrate may be an opaque material such as silicon and the light is emitted through the opposing electrode.

In a preferred embodiment, the light emitting device of the invention comprises a light emitting element comprising a dendrimer according to the invention.

In a preferred embodiment, the light emitting device of the invention comprises a layer of a dendrimer according to the invention together with one or more layers of other materials. In a preferred embodiment, the light emitting device of the invention includes a hole-transporting and/or electron-transporting layer. In a preferred embodiment of the light emitting device of the invention, the layer containing the dendrimer also contains another material, preferably an organic material. In a preferred embodiment, the light emitting device of the present invention is a light emitting diode (LED).

The dendrimers of the present invention can be deposited by known solution processing methods, such as spin-coating, printing or dip-coating. The dendrimer can be deposited as a neat film or as a blend with dendrimers, polymers and/or molecular materials. The thickness is typically 10 nm to 1000 nm, preferably less than 200 nm, more preferably 30-120 nm. Other organic layers, for example charge transporting materials, can be deposited on top of the dendrimer film by evaporation, or by solution processing from a solvent in which the first layer is not soluble.

The dendrimers can also be used in other semiconducting devices including photodiodes, solar cells, FET or a solid state triode.

BRIEF DESCRIPTION OF DRAWINGS FIGURES

The following Examples further illustrate the present invention.

EXAMPLES

Figure 1:
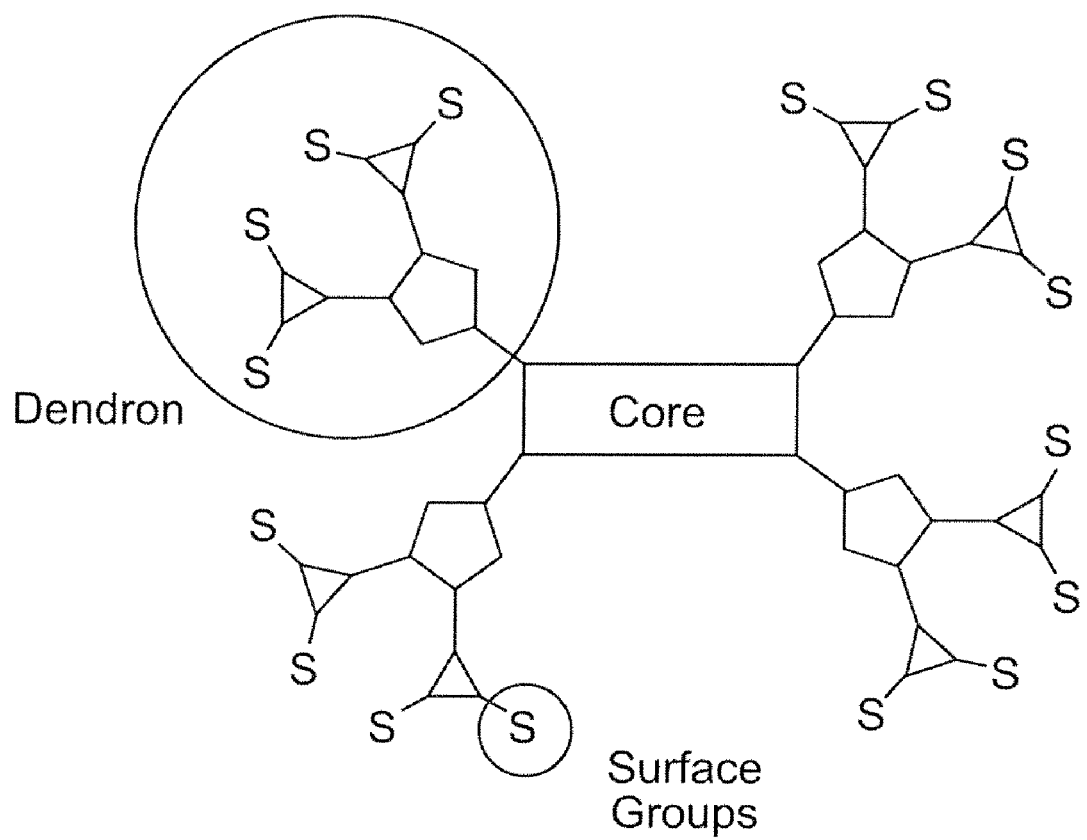
FIG. 1 is a schematic diagram of a dendrimer in accordance with the invention.
Figure 2:
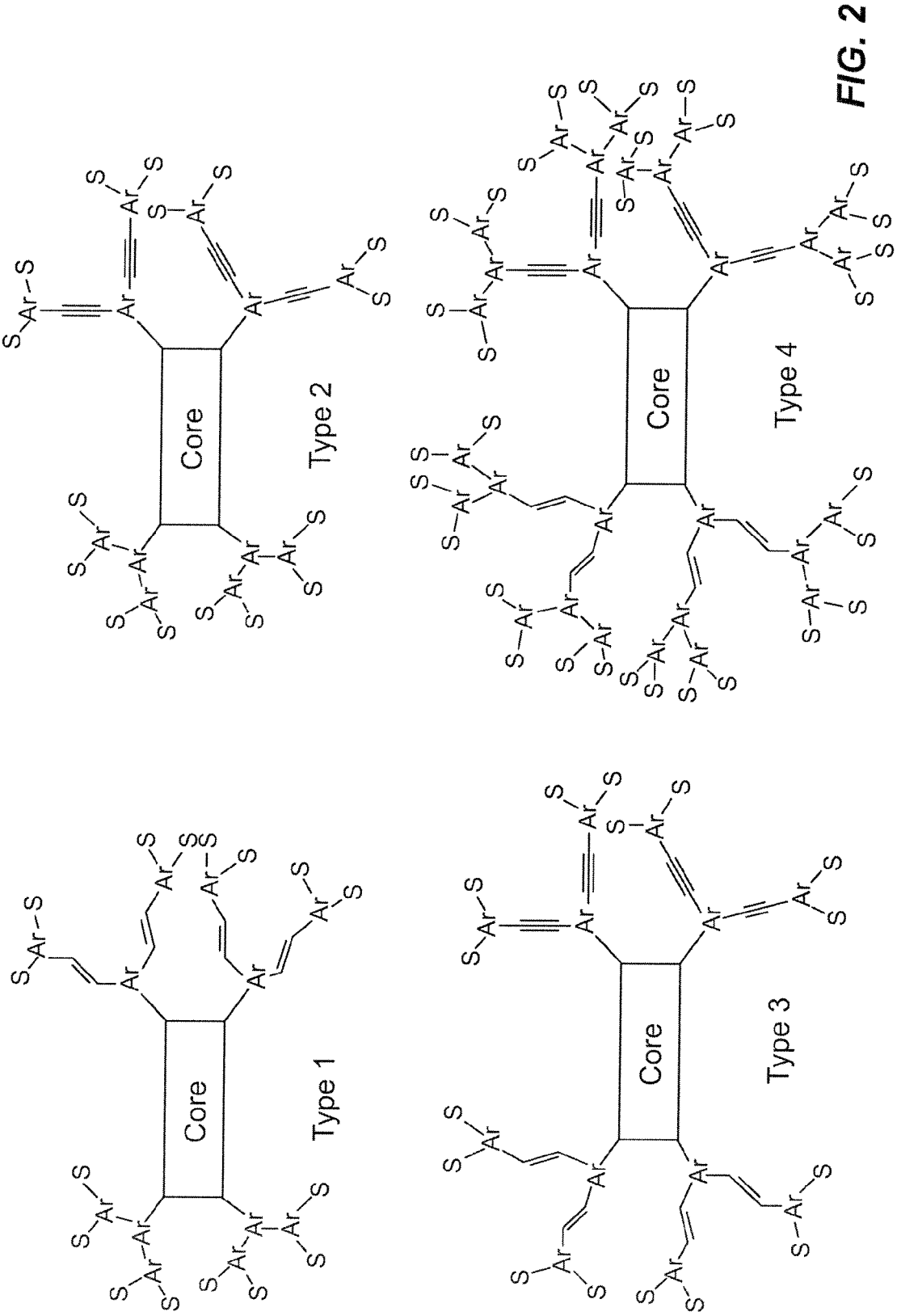
FIG. 2 shows the structures of several dendrimers in accordance with the invention.
Figure 3:
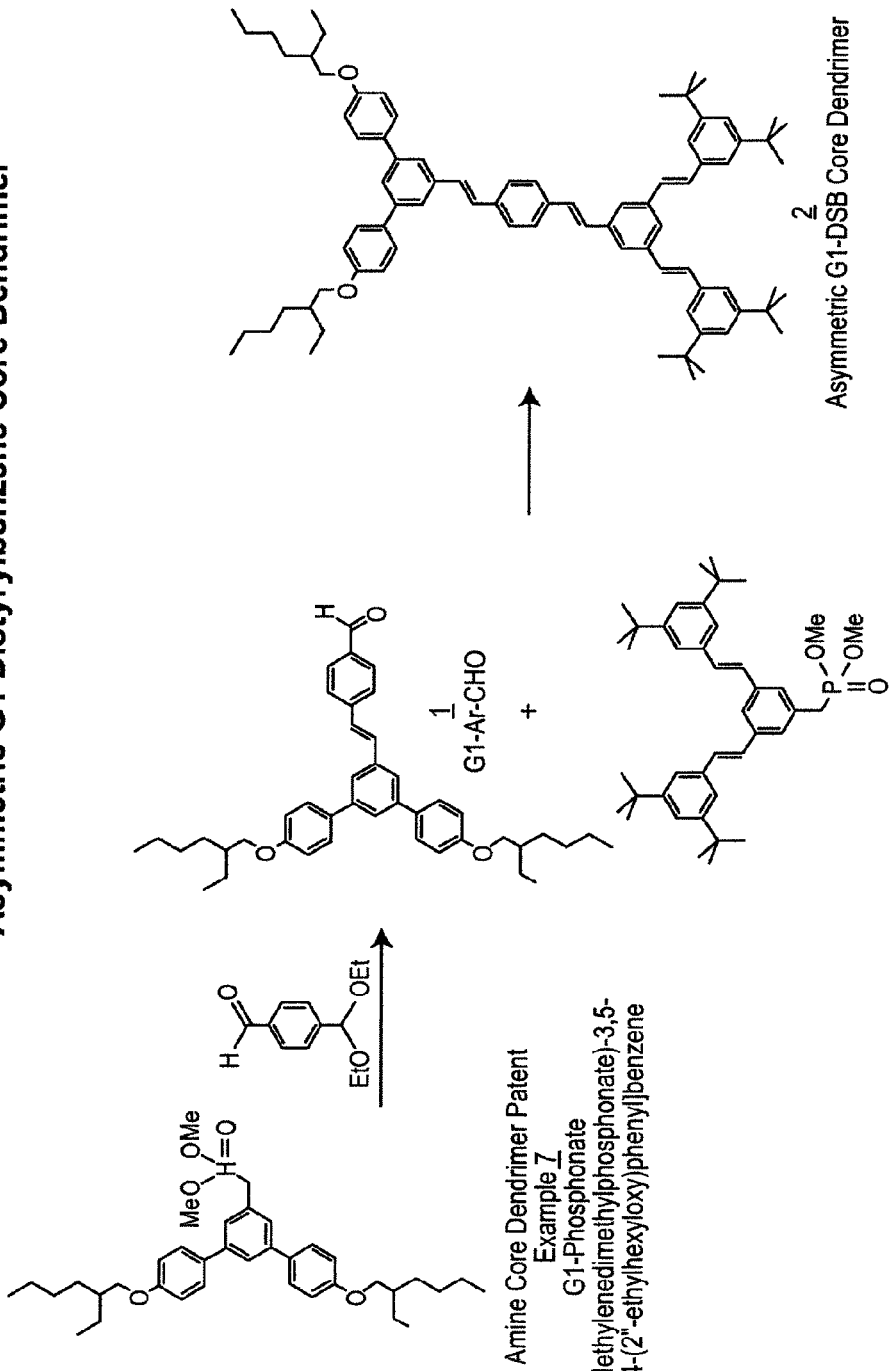
FIG. 3 shows a reaction scheme for the preparation of dendrimers in accordance with the invention.
Figure 7:
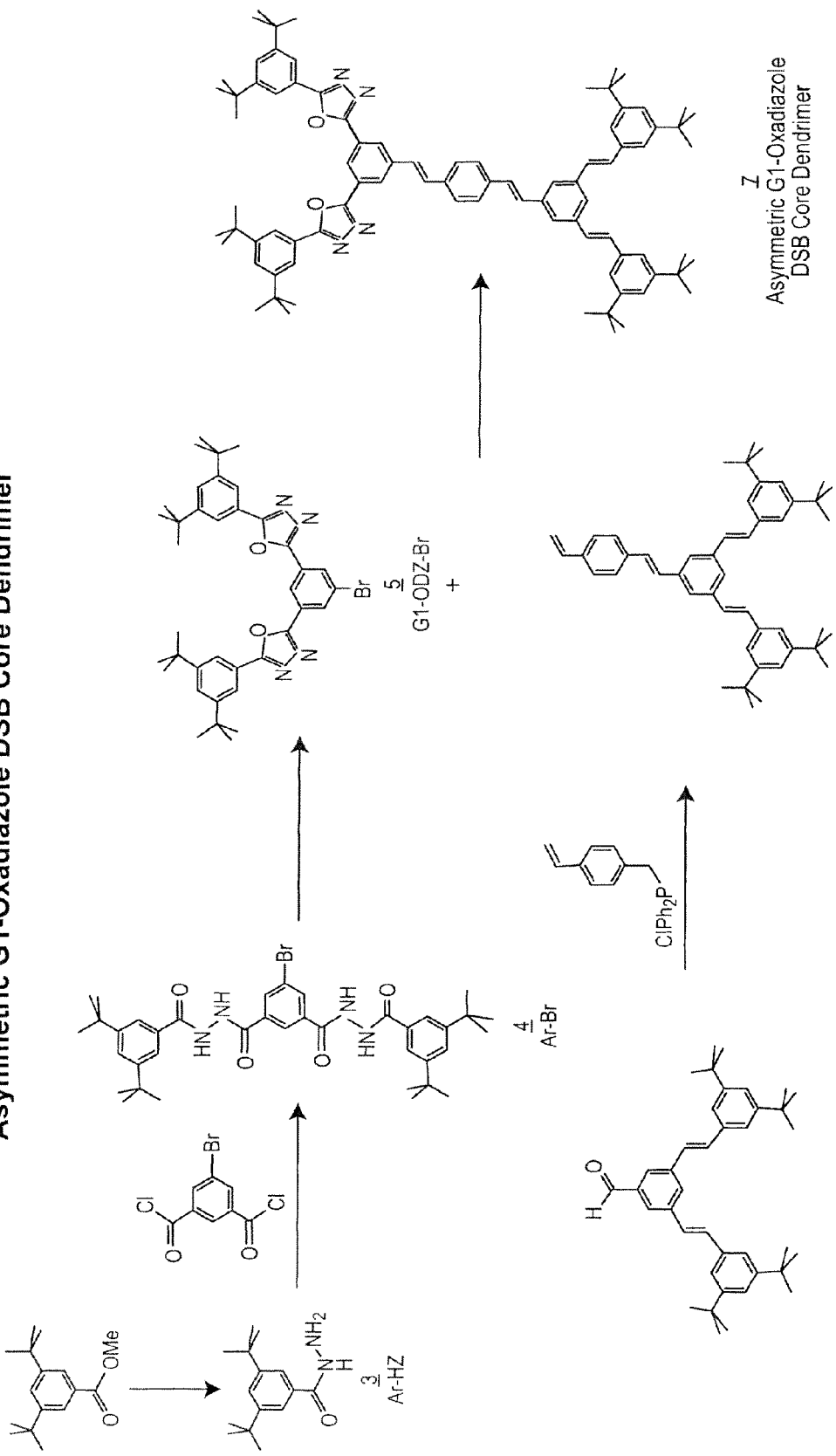
FIG. 7 shows an alternative reaction scheme for the preparation of dendrimers in accordance with the invention.

A distyryl benzene dendrimer was prepared comprising dendrons with aryl-vinyl-aryl linkages and with aryl-aryl linkages. The reaction scheme is shown in FIG. 3, and the synthesis detailed in examples 1-2. A distyryl benzene cored dendrimer was also prepared comprising dendrons with aryl-vinyl-aryl linkages and phenyl-oxadiazole-phenyl linkages. The reaction scheme for this second compound is shown in FIG. 7, and the synthesis detailed in examples 3-7.

Example 1

G1-Ar—CHO (1)

4-{3',5'-Di[4''-(2'''-ethylhexyloxy)phenyl] styryl}benzaldehyde

A mixture of the G1-Phosphonate: 1-(methylenedimethylphosphonate)-3,5-di[4'-(2''-ethylhexyloxy)phenyl]benzene of Example 7 of WO 01/59030 (370 mg, 0.607 mmol), (terephthaldehyde mono(diethylacetal) (105 mg, 0.507 mmol), potassium tert-butoxide (68 mg, 0.606 mmol) and anhydrous THF (15 cm$^3$) was stirred at room temperature under argon for 24 h before being cooled. 9 cm$^3$ of 3 M HCl$_{(aq)}$ was then added to the mixture and it was stirred at room temperature for further 2 h. The aqueous layer was separated and extracted with DCM (2×10 cm$^3$). The DCM extracts and the organic portion were dried over anhydrous magnesium sulfate, filtered, and the solvents were completely removed to leave a yellow oil. Purification by column chromatography over silica gel using ethyl acetate-light petroleum (0:1 to 1:10) as eluent gave 246 mg (79%) of 1 as a light yellow oil.

Example 2

Asymmetric G1-DSB Core Dendrimer (2)

1-[3',5'-Dis(3'',5''-di-tert-butylstyryl)styryl]-4{-3''', 5'''-di[4''''-(2'''''-ethylhexyloxy)phenyl] styryl}benzene Potassium tert-butoxide (24 mg, 0.217 mmol) was added to a solution of the aldehyde 1 (113 mg, 0.181 mmol), [G-1] phosphonate: 1-(methylenedimethylphosphonate)-3,5-bis (3',5'-di-tert-butylstyryl)benzene of Example 2A of WO 01/59030 (136 mg, 0.217 mmol) in 6 cm$^3$ of anhydrous THF at room temperature under argon. After being stirred for 24.5 h, the mixture was quenched with 3 cm$^3$ of water. The aqueous layer was separated and washed with DCM (2×3 cm$^3$). The combined DCM extracts and the organic layer were dried over anhydrous magnesium sulfate, filtered, and the solvents were completely removed. The residue was purified by column chromatography over silica gel with ethyl acetate-light petroleum (1:10) as eluent to give 247 mg of a yellowish foam.

The foam and catalytic amount of 12 were then dissolved in 3 cm$^3$ of toluene. The solution was heated at reflux for 4 h before being cooled, washed with aqueous sodium metabisulfite solution (10%, 1×5 m$^3$), brine (1×5 cm$^3$) and dried (MgSO$_4$), filtered. The solvent was completely removed. Purification by column chromatography over silica gel using ethyl acetate-light petroleum (0:1 to 1:10) as eluent gave 241 mg (99%) of 2 as a light yellow/green solid; (Found: C, 88.0; H, 9.2. C$_{82}$H$_{102}$O$_2$ requires C, 88.0; H, 9.2%); $\lambda_{max}$/nm (thin film) 242, 293, 327, 370sh, and 396sh; $\delta_H$(400 MHz; CD$_2$Cl$_2$) 0.97-1.06 (12 H, m, Me), 1.39-1.67 (52 H, m, CH$_2$ & t-Bu), 1.78-1.92 (2 H, m, CH), 3.94-4.03 (4 H, m, ArOCH$_2$), 7.07-7.74 (32 H, ArH & vinyl H); m/z [MALDI] 1119 (M$^+$).

Example 3

Ar—HZ (3)

A mixture of methyl 3,5-di-tert-butylbenzoate (3.88 g, 15.6 mmol), hydrazine hydrate (2.35 g, 46.9 mmol) and MeOH (20 cm$^3$) was heated at reflux overnight. The mixture was allowed to cool and 60 cm³ of water was added. The mixture was extracted with ether (3×30 cm³). The ether extracts were combined and washed with NaHCO$_{3(sat)}$ (1×50 cm³), brine (1×50 cm³), dried (MgSO$_4$) and filtered. The solvent was completely removed to give 3.68 g (94%) of 3 as a white solid; m/z [APCI$^+$] 249 (MH$^+$).

Example 4

Ar—Br (4)

A solution of 3 (2.70 g, 10.9 mmol) in 25 cm³ of anhydrous THF was added to a mixture of 5-bromo-1,3-benzenedicarbonyl dichloride (1.36 g, 4.83 mmol) and anhydrous THF (5 cm³) under argon. The reaction was stirred at room temperature overnight. The solvent was removed completely. The residue was purified by column chromatography over silica gel using MeOH-DCM (1:99) as eluent and then recrystallised from DCM-MeOH to give 4 (2.45 g, 72%); $\delta_H$(200 MHz; CDCl$_3$) 1.30 (36 H, s, t-Bu), 7.56-7.65 (6 H, m, ArH), 8.13 (2 H, s, ArH), 8.42 (1 H, s, ArH), 9.43 (2H, br s, CONH), and 10.58 (2 H, br s, CONH); [APCI$^+$] 707, and 705 (MH$^+$).

Example 5

G1-ODZ-Br (5)

3,5-Bis[5'-(3",5"-di-tert-butylphenyl)-[1',3', 4']-oxadiazole-2'-yl]phenyl bromide A mixture of aryl bromide 4 (3.00 g, 4.26 mmol) and phosphorous oxychloride (30 cm³, 9.6 mmol) was heated at reflux under argon overnight. After cooling, the excess phosphorous oxychloride was removed under reduced pressure. Water (50 cm³) and ether (40 cm³) were added. The two phases were separated. The aqueous layer was extracted with ether (2×40 cm³). The organic layer and the ether extracts were combined and washed with water (1×50 cm³), NaHCO$_3$ $_{(sat)}$ (1×50 cm³), dried over anhydrous magnesium sulphate, filtered, and the solvent removed in vacuo to give a white solid. Recrystallisation from DCM-light petroleum gave 2.20 g (78%) of 5 as a white crystalline solid; $\nu_{max}$(KBr)/cm$^{-1}$ 1601 (C=N), and 1541 (C=C); $\lambda_{max}$(CH$_2$Cl$_2$)/nm 293 (log ε 4.92); $\delta_H$(400 MHz; CDCl$_3$) 1.43 (36 H, s, t-Bu), 7.67 (2 H, t, J 2.0 Hz, ArH), 8.01 (4 H, d, J 2.0 Hz, ArH), 8.51 (2 H, d, J 1.5 Hz, ArH), and 8.84 (1 H, s, ArH); $\delta_C$(100 MHz, CDCl$_3$) 31.4, 35.1, 121.5, 122.7, 123.5, 123.8, 126.5, 126.8, 132.3, 152.0, 162.4, and 166.2; m/z [APCI$^+$] 671, and 669 (MH$^+$).

Example 6

G1-Ar—Sty (6)

1-vinyl-4-[3',5'-di(3",5"-di-tert-butylstyryl)styryl]benzene

Lithium ethoxide (1.0 M, 5.2 cm3, 5.2 mmol) was added dropwise over 20 minutes to a suspension of the 3,5-di(3',5'-di-tert-butylstyryl)benzaldehyde (see WO 99/21935) (1.40 g, 2.61 mmol), 4-vinylbenzyltriphenylphosphonium chloride (1.30 g, 3.14 mmol) and 15 cm³ of ether. The mixture was stirred at room temperature for 1 h and then washed with water (2×30 cm³) and brine (1×30 cm³), and dried (MgSO$_4$) and filtered. The solvent was completely removed to leave a white solid. The solid was dissolved in DCM and passed through a plug of silica gel using DCM as eluent. The filtrate was collected and the solvent was completely removed.

The solid and catalytic amount of I$_2$ were then dissolved in 60 cm³ of toluene. The mixture was heated at reflux for 2 h before being cooled, washed with aqueous sodium metabisulfite solution (10%, 1×30 m³), brine (1×40 cm³) and dried (MgSO$_4$) and filtered. The solvent was completely removed. Purification by column chromatography over silica gel using DCM-light petroleum (1:4) as eluent and then recrystallisation from DCM-MeOH gave 1.19 g (72%) of 6 as a white solid; $\delta_H$(200 MHz; CDCl$_3$) 1.39 (36 H, s, t-Bu), 5.28 (1 H, d, J 11.6 Hz, vinyl H), 5.81 (1 H, d, J 17.4 Hz, vinyl H), 6.76 (1 H, dd, J 11.6 & 17.4 Hz, vinyl H), 7.12-7.69 (19 H, ArH & vinyl H); m/z [APCI$^+$] 635 (MH$^+$).

Example 7

Asymmetric G1-oxadiazole DSB Core Dendrimer (7)

1-{3',5'-Di[5"-(3'",5'"-di-tert-butylphenyl)-2"-[1",3", 4"]oxadiazole]styryl}-4-[3"",5""-di(3""",5"""-di-tert-butylstyryl)styryl]benzene A rapidly stirred suspension of 6 (215 mg, 0.340 mmol), 5 (227 mg, 0.340 mmol), sodium carbonate (43 mg, 0.410 mmol), 2,6-di-tert-butyl-p-cresol (7.5 mg, 34 μmol), trans-di (μ-aceto)-bis[o-(di-o-tolylphosphino)benzyl] dipalladium (II) (2 mg, 2.0 μmol) and N,N-di-methylacetamide (1.0 cm³) was deoxygenated by alternate exposure to a high vacuum and flushing with argon for 30 minutes. The solution was heated at 130° C. for 17 hours and then was allowed to cool. DCM (50 cm³) and water (50 cm³) were added to the mixture and the organic phase was separated, washed with water (2×20 cm³) and brine (20 cm³), dried over anhydrous magnesium sulphate, filtered and the solvent removed to give a yellow residue. The residue was purified by column chromatography over silica using ethyl acetate-DCM (0:1 to 1:19) as eluent to give 214 mg (51%) of 7 as a pale yellow solid; mp>200° C. (decomp.); $\nu_{max}$(KBr)/cm$^{-1}$ 1595 (C=N), 1544 (C=C), and 959 (C=C—H trans); $\lambda_{max}$/nm (thin film) 309, and 367; $\delta_H$(400 MHz; CDCl$_3$) 1.41 (36 H, s, t-Bu), 1.46 (36 H, s, t-Bu), 7.18-7.35 (14 H, m, vinyl H & ArH), 7.64-7.66 (9 H, m, ArH), 8.06 (4 H, d, J 1.5 Hz, ArH), 8.54 (2 H, d, J 1.0 Hz, ArH), and 8.74 (1 H, t, J 1.0 Hz, ArH); m/z [MALDI] 1287 (MCu$^+$), and 1224 (MH$^+$).

Examples 8 and 9

The dendrimers of Examples 2 and 7 are used as emissive materials in light-emitting diodes in Examples 8 and 9, respectively. The dendrimers, and dendrimers doped with different concentrations of PBD (2-(4-biphenyl)-5-(4-tert-butylphenyl)-1,3,4-oxadiazole) or PVK (poly-(9-vinyl)carbazole), were dissolved in tetrahydrofuran (THF) solution at a dendrimer concentration of 10 mg/ml. The devices were fabricated as follows:

1. ITO treatment: The strip-etched ITO substrates were washed in an ultrasonic bath of acetone, followed by iso-propanol, and finally dried before use.
2. PEDOT: The PEDOT (poly(2,3-ethylenedioxythiophene Bayer) was spin-coated onto a treated ITO substrate at a spin speed of 2500 rpm, and baked on a hotplate at 100-150° C. for at least 30 min before spin-coating the dendrimer layer.
3. Single-layer device: The dendrimer, or dendrimer doped with PBD or PVK, was spin-coated onto the substrate covered by PEDOT at a spin speed of 1000-1500 rpm, then baked at 50° C. for at least 30 min to remove solvent from the film. The resulting films were 80-100 nm thick. The cathode was formed by the thermal evaporation of Al or MgAl at a pressure of around 3×10-6 mbar. The thickness of Al or MgAl was approximately 200 nm.

Figure 4:
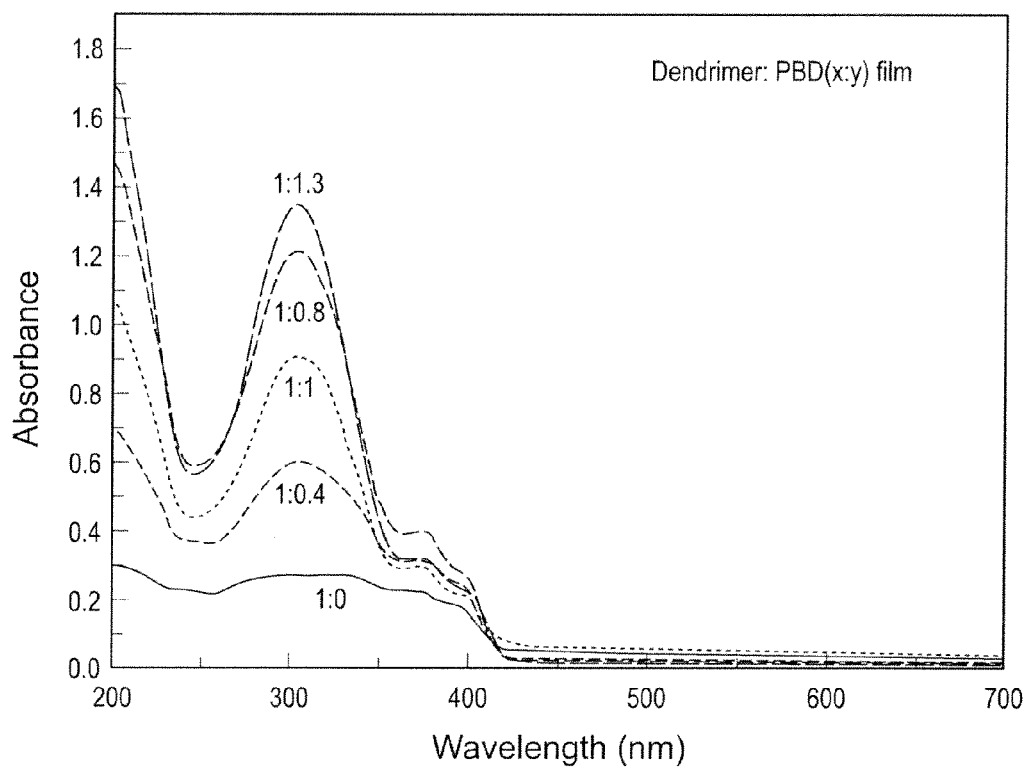
FIG. 4 shows the absorption and photoluminescence spectra of a blend comprising dendrimers in accordance with the invention and PBD.
Figure 4:
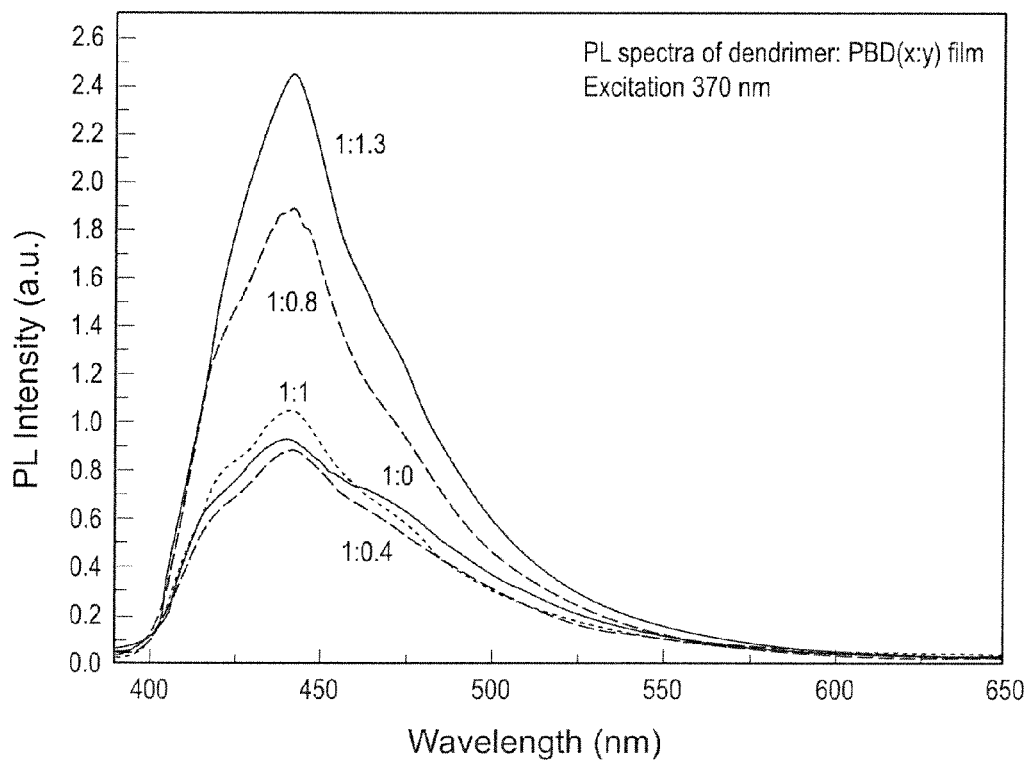
Figure 5:
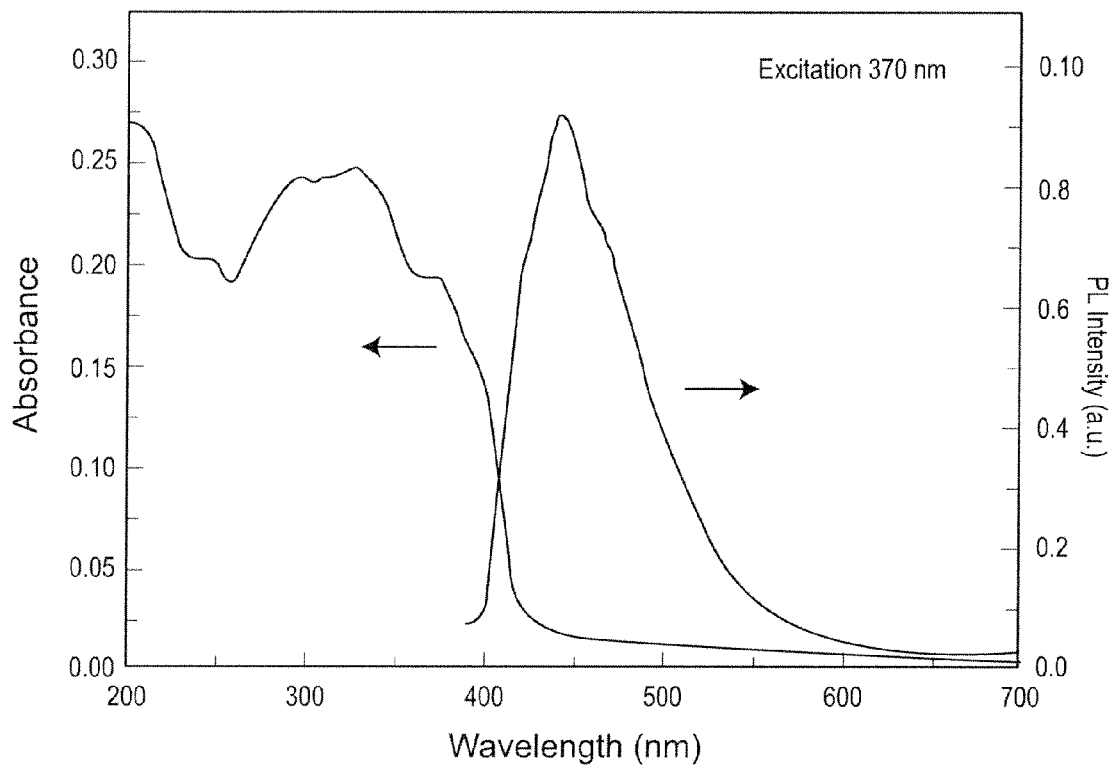
FIG. 5 shows the absorption and photoluminescence spectra of a film comprising dendrimers in accordance with the invention and the electroluminescence emission spectrum of a device including the same.
Figure 5:
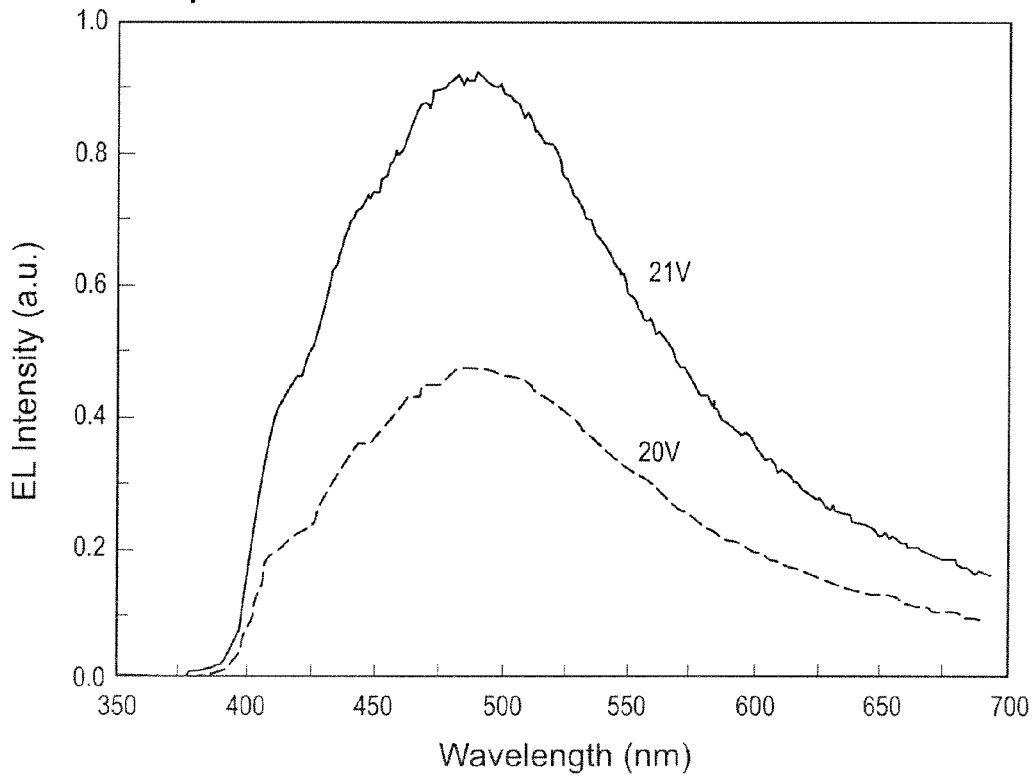
Figure 8:
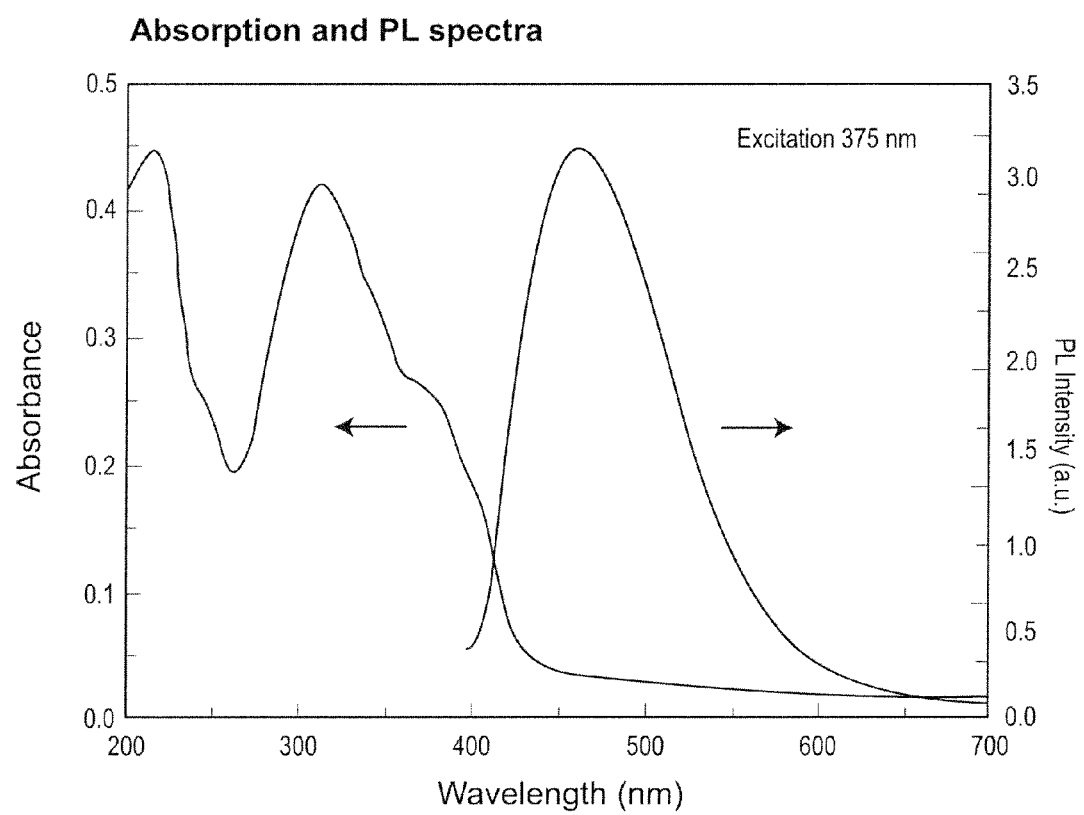
FIG. 8 shows the absorption and photoluminescence spectra of a film comprising dendrimers in accordance with the invention.

FIG. 5 (top) shows the absorption and PL emission spectra of a film of compound 2. FIG. 4 shows the absorption and PL emission of a film of a blend of compound 2 and 2-(4-biphenylyl)-5-(4-tert-butylphenyl)-1,3,4-oxadiazole (PBD). FIG. 8 shows the absorption and PL emission spectra of a film of compound 7.

Figure 6:
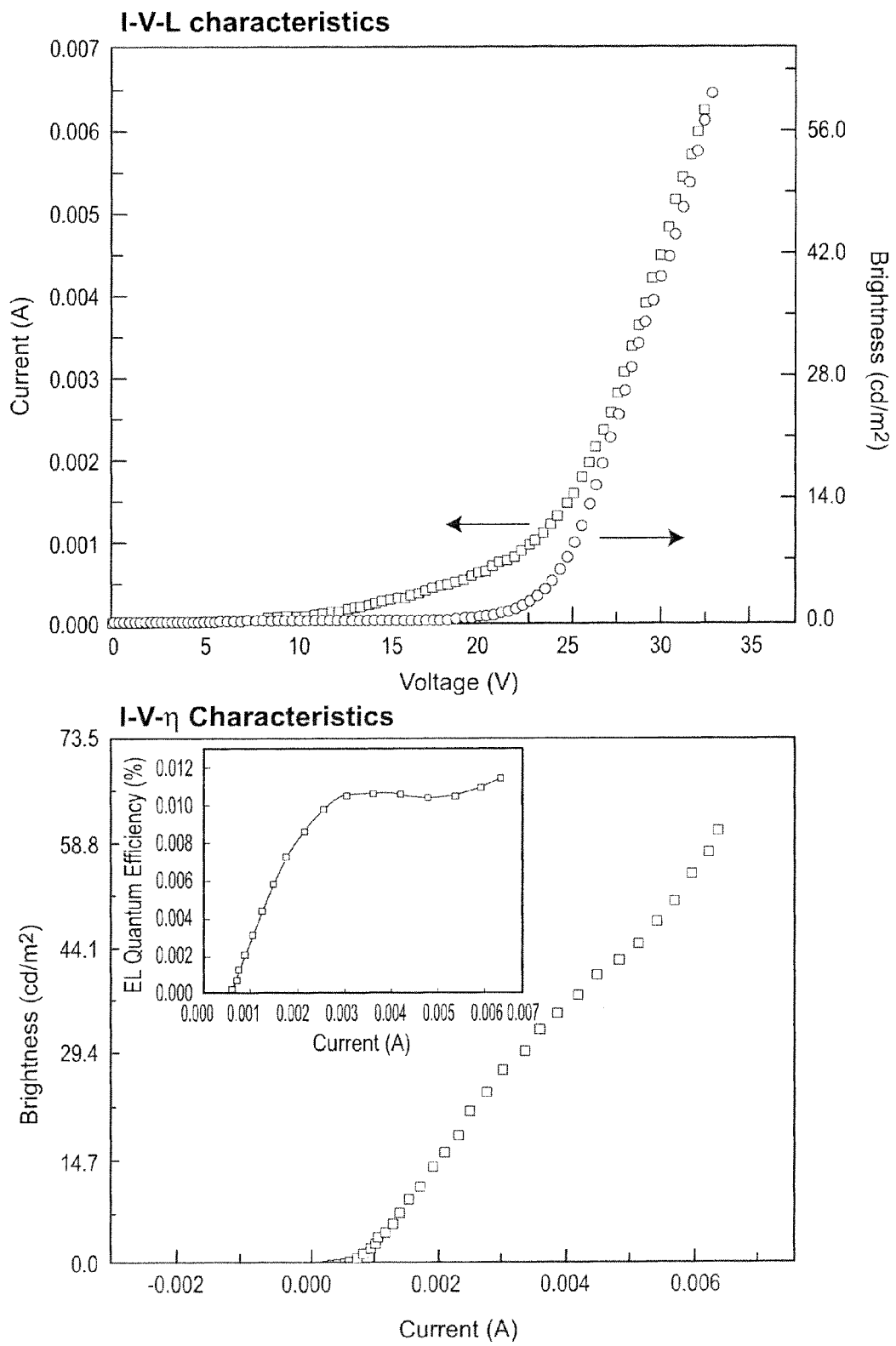
FIG. 6 shows the current-voltage-luminance characteristics and the current-luminance-efficiency characteristics of a device in accordance with the invention.
Figure 9:
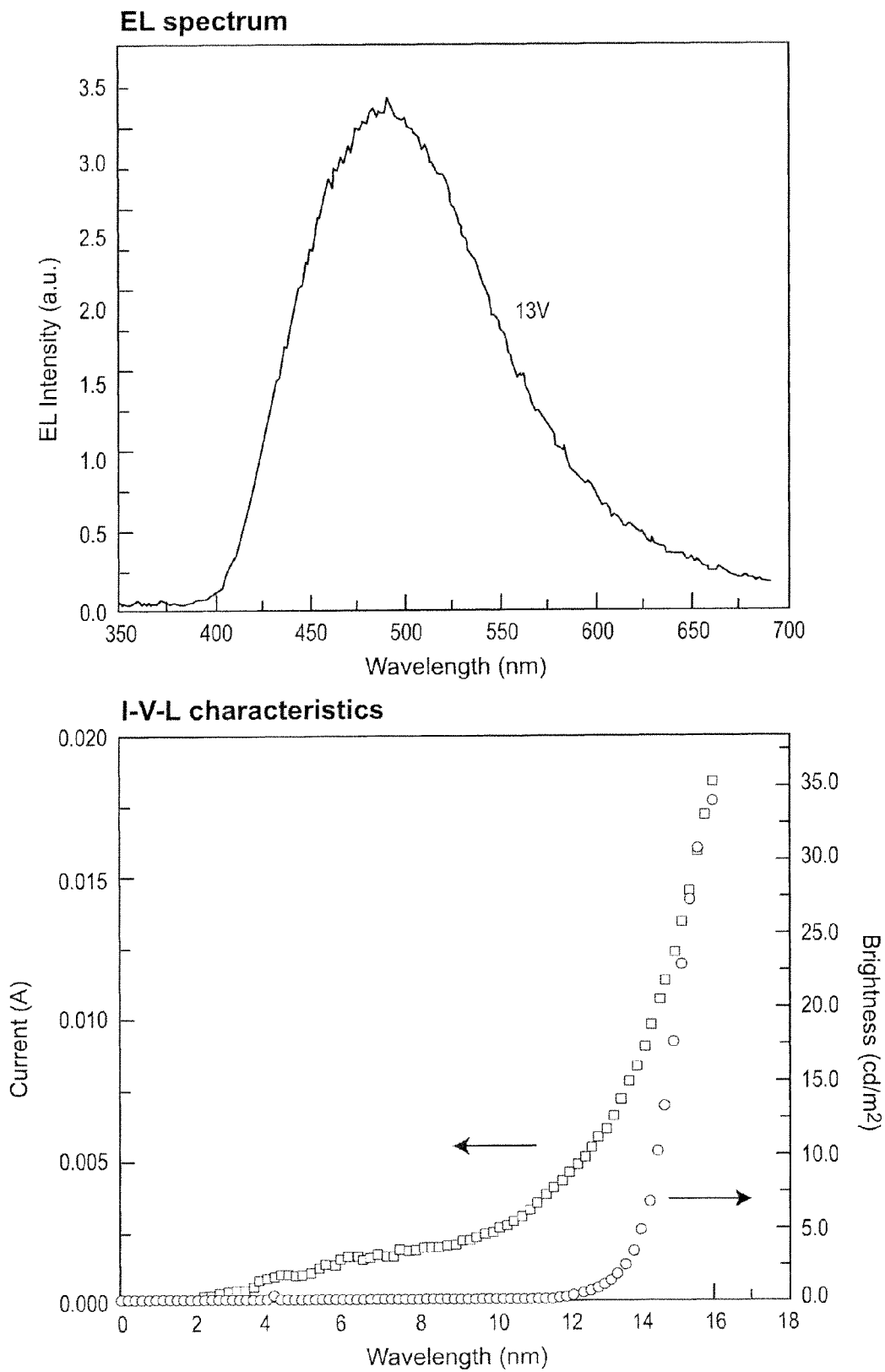
FIG. 9 shows the electroluminescence emission spectrum and the current-voltage-luminance characteristics of a device including a film comprising dendrimers in accordance with the invention.
Figure 10:
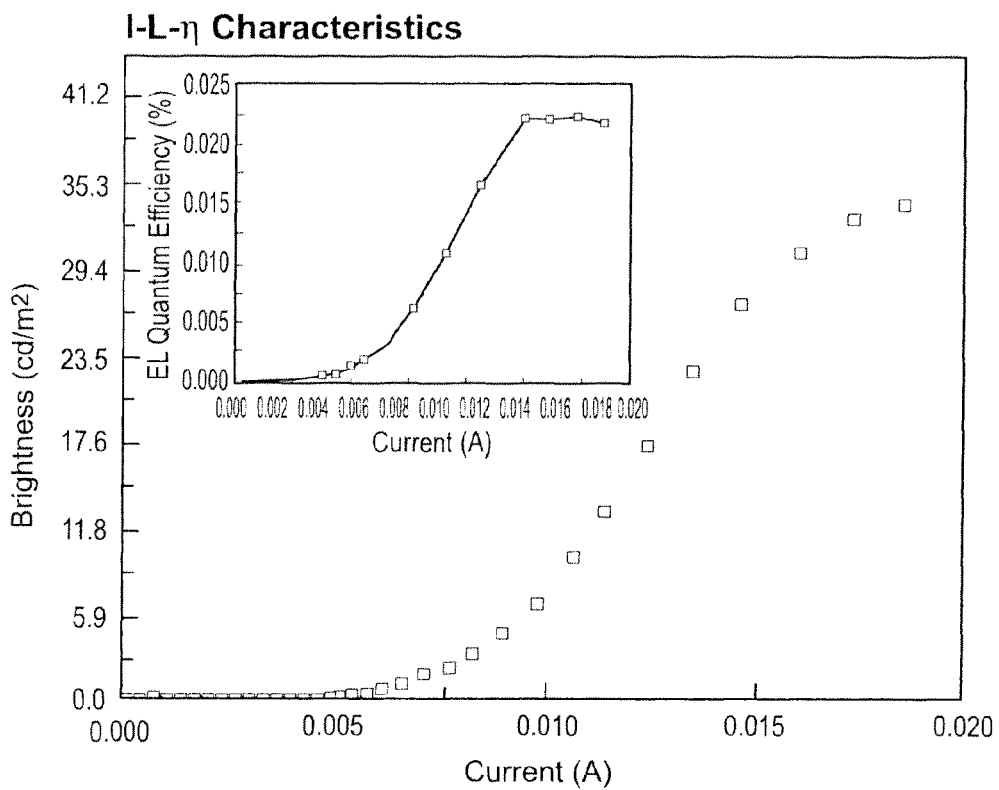
FIG. 10 shows the current-luminance-efficiency characteristics of a device in accordance with the invention.
Figure 11:
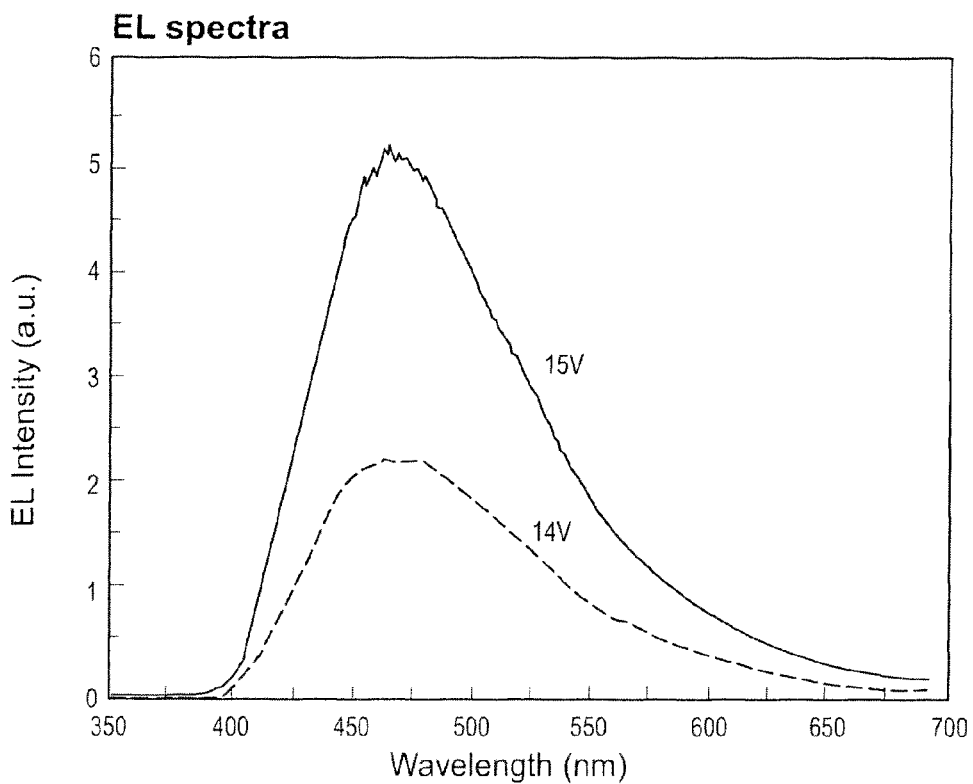
FIG. 11 shows the electroluminescence emission spectrum of a device in accordance with the invention.
Figure 12:
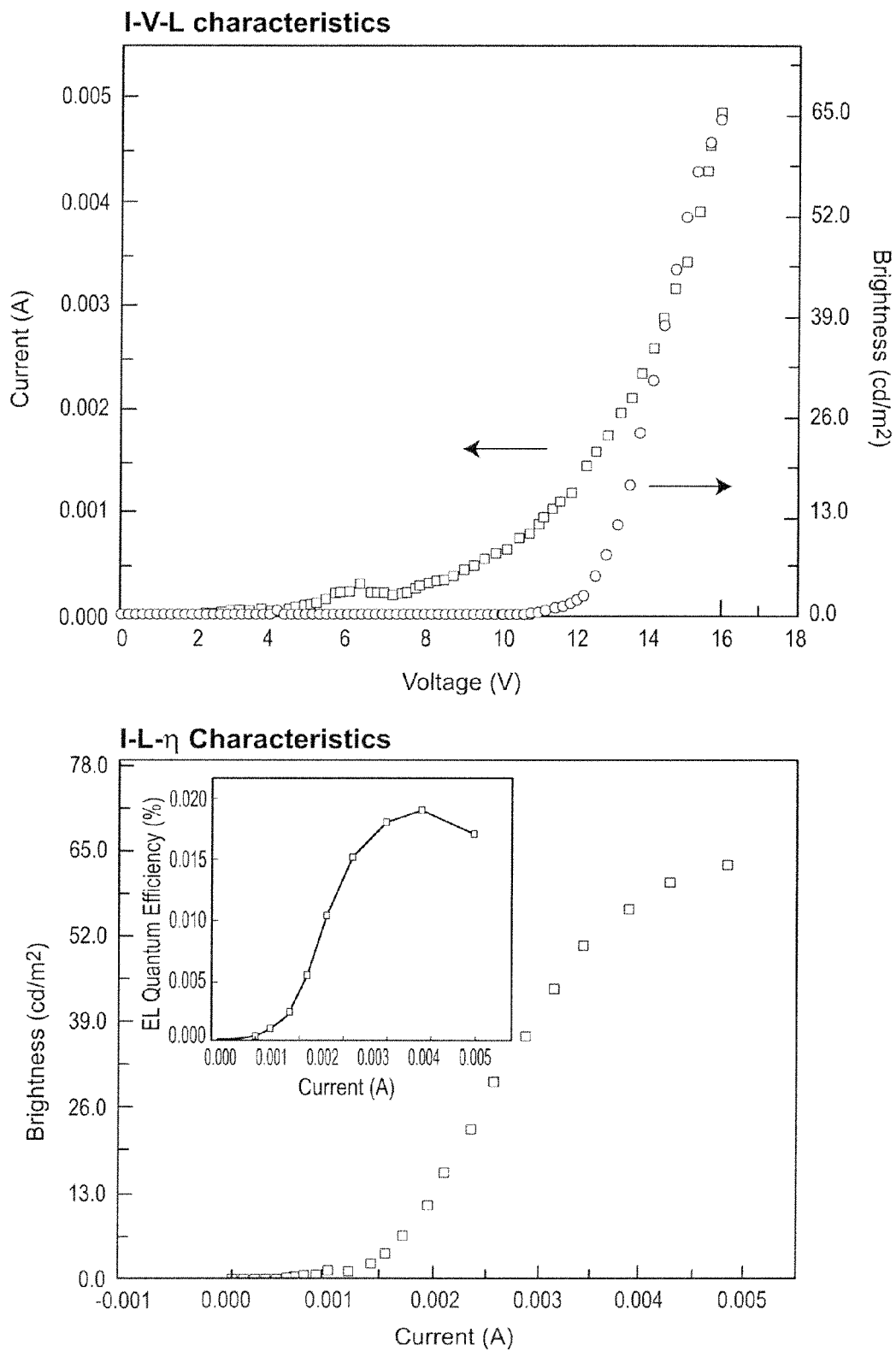
FIG. 12 shows the current-voltage-luminance characteristics and the current-luminance-efficiency characteristics of a device in accordance with the invention.

The dendrimers of Examples 2 and 7 have been incorporated into single layer devices. In the case of the distyrylbenzene dendrimers (example 2) unoptimised devices with structure ITO/PEDOT/dendrimer2/Mg/Al had an EL efficiency of 0.01%, brightness of 65 cd/m$^2$, and a power efficiency of 0.002 Lm/W. FIG. 5 (bottom) shows the EL emission spectrum of the device. FIG. 6 shows the current-voltage-luminance characteristics (top) and the current-luminance-efficiency characteristics (bottom). In the case of 7, unoptimised devices with structure ITO/PEDOT/dendrimer 7/Mg/Al had an EL efficiency of 0.002%, brightness of 38 cd/m$^2$, and a power efficiency of 0.0009 Lm/W. FIG. 9 (top) shows the EL spectrum of the device ITO/PEDOT/dendrimer 7/MgAl and (bottom) shows the current-voltage-luminance characteristics. FIG. 10 shows the current-luminance-efficiency characteristics of the same device. However, when 7 was used as a blend in PVK (1:0.5) in the same device configuration the device properties improved so that EL efficiency was 0.02% with brightness of 60 cd/m$^2$, and a power efficiency of 0.01 Lm/W suggesting that 7 was an electron transporter. The EL spectrum, current-voltage-luminance characteristics, and current-luminance-efficiency characteristics of the ITO/PEDOT/PVK: 7/MgAl device are shown in FIGS. 11 and 12, respectively.

Example 10

A dendron was synthesised that comprised a mixture of aryl-acetylenyl-aryl links and aryl-vinyl-aryl links, i.e. that had different links within one dendron, and this was used to form both a porphyrin cored dendrimer (6) and a divinylbenzene cored dendrimer (8).

Figure 13:
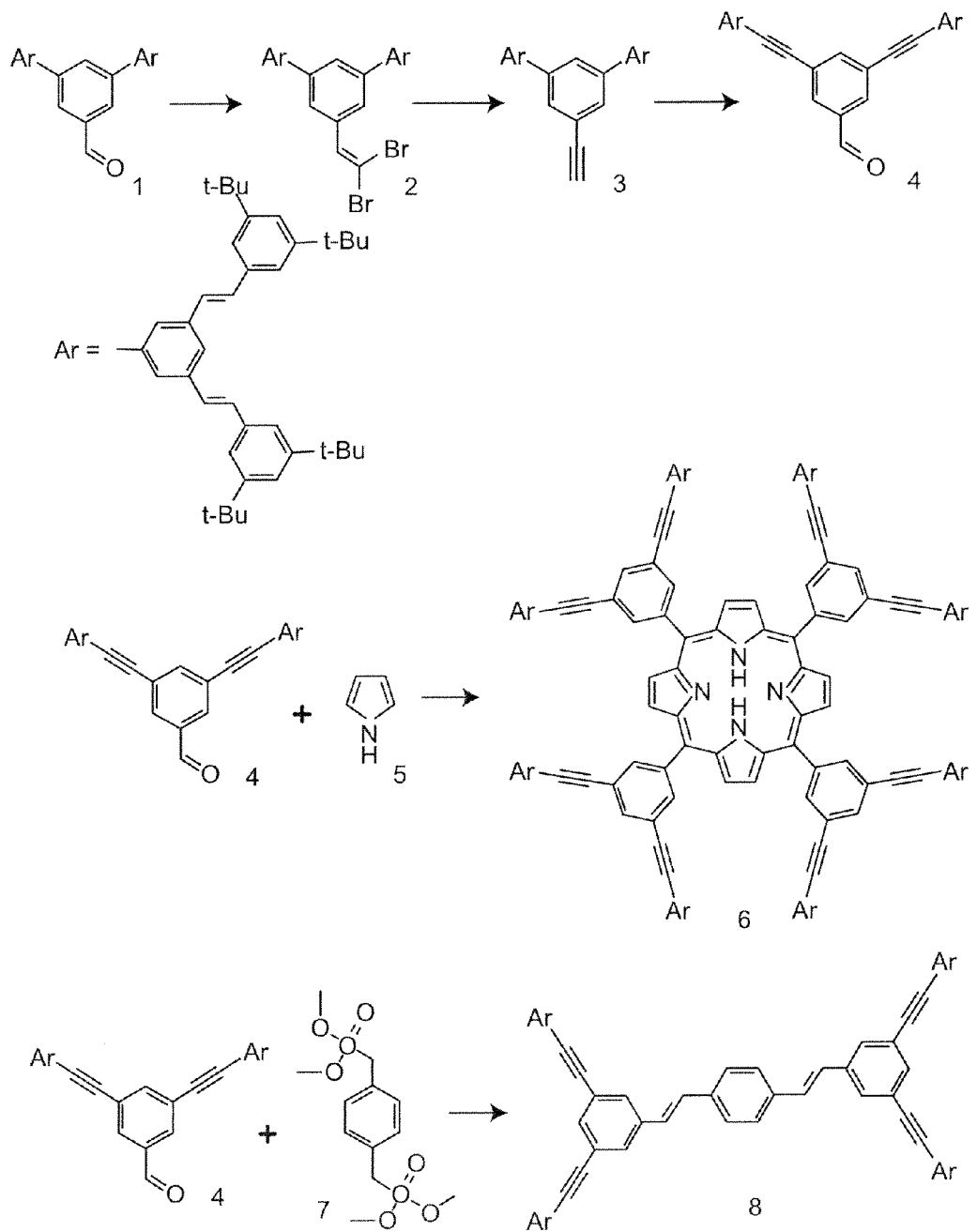
FIG. 13 shows distyrylbenzene and porphyrin cored dendrimers in accordance with the invention and the process for making the same; and, FIG. 14 shows distyrylbenzene cored dendrimers in accordance with the invention and the process for making the same.

Distyrylbenzene and porphyrin cored dendrimers containing both alkene and acetylene links in the dendrons and the process for making them are set out in FIG. 13; the numbers apply accordingly.

1,1-Dibromo-2-{3,5-bis[2-(3,5-di-tert-butylphenyl) vinyl]phenyl}ethene (2)

Triphenylphosphine (3.92 g, 14.96 mmol) was added in one portion to a stirred solution of −3,5-bis[2-(3,5-di-tert-butylphenyl)vinyl]benzaldehyde (1) (2.00 g, 3.74 mmol) and carbon tetrabromide (2.48 g, 7.38 mmol) in dichloromethane (20 mL). Heat was evolved and the mixture stirred at room temperature for 75 min. The resultant orange suspension was washed with water (2×50 mL), dried over anhydrous magnesium sulphate, filtered and the solvent removed to leave an orange-brown residue, which was purified by passing through a plug of silica with dichloromethane-light petroleum (2:3) as eluent. The solvent was removed to give 2-{3,5-bis[2-(3,5-di-tert-butylphenyl)vinyl]phenyl}-1,1-dibromoethene(2) as a white foam (2.45 g, 95%) mp 148-150° C. (Found: C, 69.5; H, 7.3; C$_{40}$H$_{50}$Br$_2$ requires C, 69.6; H, 7.3%); $\nu_{max}$(KBr)/cm$^{-1}$ 1595 (C=C) and 958 (C=C—H trans); $\lambda_{max}$(CH$_2$Cl$_2$)/nm 306 (log($\epsilon$/dm3 mol$^{-1}$cm$^{-1}$) 4.85), 317 (4.85) and 329sh (4.73); $\delta_H$(400 MHz, CDCl$_3$) 1.40 (36 H, s, t-butyl), 7.14 and 7.24 (4 H, d, J 16, vinyl H) 7.40 (2 H, dd, J 1.5, sp H), 7.42 (4 H, d, J 1.5, sp H), 7.56 (1 H, s, CHCBr$_2$), 7.60 (2 H, s, cp H) and 7.69 (1 H, s, cp H); m/z (CI+) 692.2 (MH$^+$, 100%), 613.2 (M—$^{79}$Br, 96%), 611.2 (M—$^{81}$Br, 90%) and 533.3 (M-2$^{79}$Br, 74%).

3,5-Bis[2-(3,5-di-tert-butylphenyl)vinyl]phenyl acetylene (3)

n-Butyllithium (2.5 M in hexanes, 2.9 mL, 7.20 mmol) was added to a solution of 1,1-dibromo-2-{3,5-bis[2-(3,5-di-tert-butylphenyl)vinyl]phenyl}ethane(2) (2.37 g, 3.43 mmol) in tetrahydrofuran (40 mL) under argon at −78° C. The mixture was stirred at −78° C. for 1 h then at room temperature for 1 h. Water (25 mL) was added and the aqueous layer separated and extracted with ether (25 mL). The organic layers were combined, washed with brine (25 mL), dried over anhydrous magnesium sulphate, filtered and the solvent removed to leave yellow foam. The residue was purified by column chromatography over silica with dichloromethane-light petroleum (1:3) as eluent. Impure fractions were combined and purified by column chromatography with dichloromethane-light petroleum (1:9) as eluent to give 3,5-bis[2-(3,5-di-tert-butylphenyl)vinyl]phenyl acetylene (3) (1.28 g, 70%) as white solid. mp 156-157° C. (Found: C, 90.6; H, 9.5; C$_{40}$H$_{50}$ requires C, 90.5; H, 9.5%); $\nu_{max}$(KBr)/cm$^{-1}$ 1595 (C=C) and 962 (C=C—H trans); $\lambda_{max}$(CH$_2$Cl$_2$)/nm 307sh (log($\epsilon$/dm$^3$ mol$^{-1}$cm$^{-1}$) 4.87), 317 (4.88) and 329sh (4.74); $\delta_H$(500 MHz, CDCl$_3$) 1.39 (36 H, s, t-butyl), 3.11 (1 H, s, CCH), 7.10 and 7.24 (4 H, d, J 16, vinyl H) 7.40 (6 H, s, sp H), 7.59 (2 H, s, cp H) and 7.67 (1 H, s, cp H); $\delta_C$(125 MHz, CDCl$_3$) 31.4, 34.8, 83.5, 120.86, 122.3, 122.6, 125.0, 125.7, 128.6, 130.8, 136.0, 138.0 and 151.0; m/z (EI) 530.4 (M$^+$, 100%).

3,5-Bis({3,5-bis[2-(3,5-di-tert-butylphenyl)vinyl] phenyl}ethynyl)benzaldehyde (4)

Nitrogen was bubbled through a solution of 3,5-bis[2-(3,5-di-tert-butylphenyl)vinyl]phenyl acetylene (3) (1.00 g, 1.88 mmol) and 3,5-dibromobenzaldehyde (191 mg, 0.725 mmol) in tetrahydrofuran (10 mL) and triethylamine (15 mL) for 15 min. Tetrakis(triphenylphosphine)palladium(0) (60 mg, 52 µmol) and copper(I) iodide (18 mg, 94 µmol) were added and nitrogen bubbled through the solution for a further 15 min and the mixture then stirred at 70° C. for 17.5 h. Once cool, the solvent was removed and the residue purified by column chromatography over silica with dichloromethane-light petroleum (1:2) as eluent to give 3,5-bis({3,5-bis[2-(3,5-di-tert-butylphenyl)vinyl]phenyl}-ethynyl)benzaldehyde (4) (714 mg, 85%) as a white solid. mp>250° C. (dec.) (Found: C, 89.5; H, 8.5; C$_{87}$H$_{102}$O requires C, 89.8; H, 8.8%); $\nu_{max}$(KBr)/cm$^{-1}$ 2215w (C≡C), 1703 (C=O), 1595 (C=C) and 957 (C=C—H trans); $\lambda_{max}$(CH$_2$Cl$_2$)/nm 318 (log($\epsilon$/dm3 mol$^{-1}$cm$^{-1}$) 5.12) and 330sh (4.93); $\delta_H$(400 MHz, CDCl$_3$) 1.41 (72 H, s, t-butyl), 7.15 and 7.30 (8 H, d, J 16.5, vinylic H), 7.42 (4 H, dd, J 1.5, sp H), 7.44 (8 H, d, J 1.5, sp H), 7.69 (4 H, d, J 1, bp H), 7.71 (2 H, s, bp H), 8.02 (1 H, dd, J 1.5, cp H), 8.06 (2 H, d, J 1.5, cp H) and 10.01 (1 H, s, CHO); $\delta_C$(100.6 MHz, CDCl$_3$) 31.5, 34.9, 87.1, 91.6, 121.0, 122.5, 123.1, 124.9, 125.3, 126.8, 128.3, 131.0, 132.0, 136.1, 136.7, 138.3, 139.6, 151.1 and 191.0; m/z (MALDI) 1163.1 (M$^+$, 100%).

5,10,15,20-Tetrakis[(3,5-bis({3,5-bis[2-(3,5-di-tert-butylphenyl)vinyl]phenyl}ethynyl)-phenyl]porphyrin (6)

A solution of trifluoroacetic acid (6.6 µL, 0.086 mmol) in dichloromethane (1.32 mL) was added to a stirred solution of 3,5-bis({3,5-bis[2-(3,5-di-tert-butylphenyl)vinyl]phenyl}-ethynyl)benzaldehyde (4) (100.0 mg, 0.086 mmol) and pyrrole (5) (6.0 µL, 0.086 mmol) in dichloromethane (2.5 mL) and the mixture stirred in the dark under argon for 12 days 18 h. 2,3-Dichloro-5,6-dicyanobenzoquinone (19.6 mg, 0.086 mmol) was added and the mixture stirred for 30 min then neutralised by the addition of an excess of sodium bicarbonate and filtered through a plug of silica, eluting with dichloromethane until the filtrate was colourless. The solvent was removed and the residue purified by column chromatography over silica with dichloromethane-light petroleum (1.4) as eluent to give 5,10,15,20-tetrakis[(3,5-bis({3,5-bis[2-(3,5-di-tert-butylphenyl)vinyl]phenyl}ethynyl)-phenyl]porphyrin (6) (38.5 mg, 37%) as a red-brown solid. $\delta_H$(400 MHz, CDCl3) −2.70 (2 H, s, NH), 1.31 (288 H, s, t-butyl H), 7.08 and 7.23 (32 H, d, J 16, vinyl H), 7.32 (16 H, dd, J 1.5, sp-H), 7.35 (32 H, d, J 1.5, sp-H), 7.65 (8 H, s, bp-H), 7.69 (16 H, s, bp-H), 8.27 (4 H, s, cp-H), 8.45 (8 H, d, J 1, cp-H) and 9.08 (8 H, s, β-pyrrolic H); m/z (MALDI) 4844.2 (M+, 100%).

1,4-Bis{[2-(3,5-bis({3,5-bis[2-(3,5-di-tert-butylphenyl)vinyl]phenyl}ethynyl)vinyl]-phenyl}benzene (8)

Tetrahydrofuran (15 mL) was added to a flask containing 3,5-bis({3,5-bis[2-(3,5-di-tert-butylphenyl)vinyl]phenyl}-ethynyl)benzaldehyde (4) (500 mg, 4.30 mmol), [4-(dimethoxyphosphorylmethyl)benzylphosphonic acid dimethyl ester (7) (65.9 mg, 2.05 mmol) and potassium tert-butoxide (57.4 mg, 5.11 mmol). The solution immediately turned red and was stirred under nitrogen for 67 h. Water (20 mL) was added and the emulsion extracted with dichloromethane (4×50 mL). The organic layers were combined, washed with brine (50 mL), dried over anhydrous magnesium sulphate, filtered and the solvent removed. Column chromatography of the residue over silica with dichloromethane-light petroleum (1:4 to 1:2) gave a yellow solid that was a mixture of isomers. The solid was heated with iodine (90 mg, 0.35 mmol) in toluene (20 mL) at 90° C. for 45 h. The solution was allowed to cool and washed with saturated aqueous sodium metabisulphite solution (20 mL) and brine (20 mL) and the solvent removed. The residue was passed through a plug of silica and recrystallised from a dichloromethane-hexanes mixture to leave a yellow solid 1,4-Bis {[2-(3,5-bis({3,5-bis[2-(3,5-di-tert-butylphenyl)vinyl]phenyl}ethynyl)vinyl]-phenyl}benzene (8) (314 mg, 64%). $\delta_H$(200 MHz, CDCl$_3$) 1.41 (144 H, s, t-butyl), 7.20-7.36 (20 H, m, vinyl H), 7.42-7.45 (24 H, m, surface phenyl H) and 7.62-7.75 (22 H, m, phenyl H).

Example 11

Figure 14:
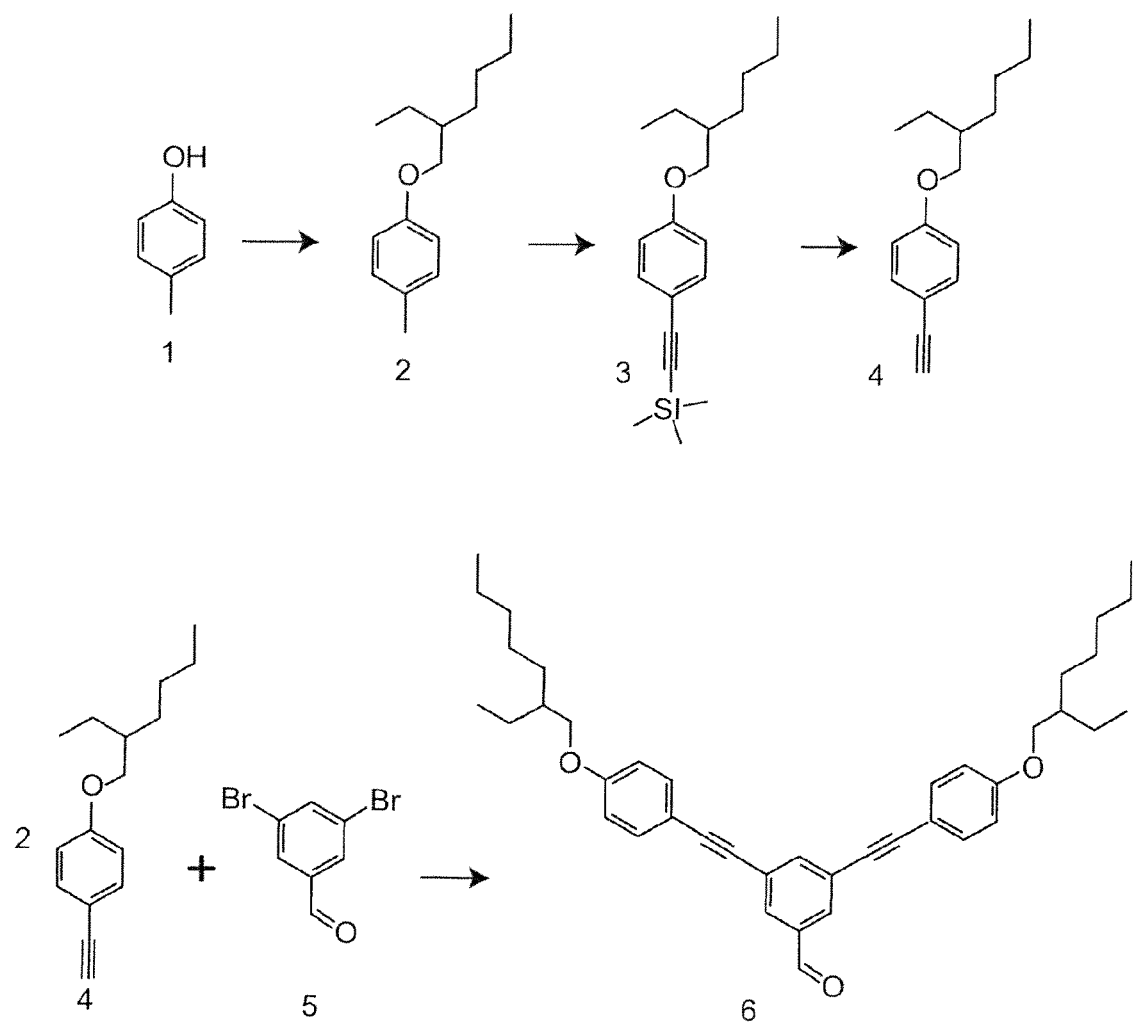
Figure 14:
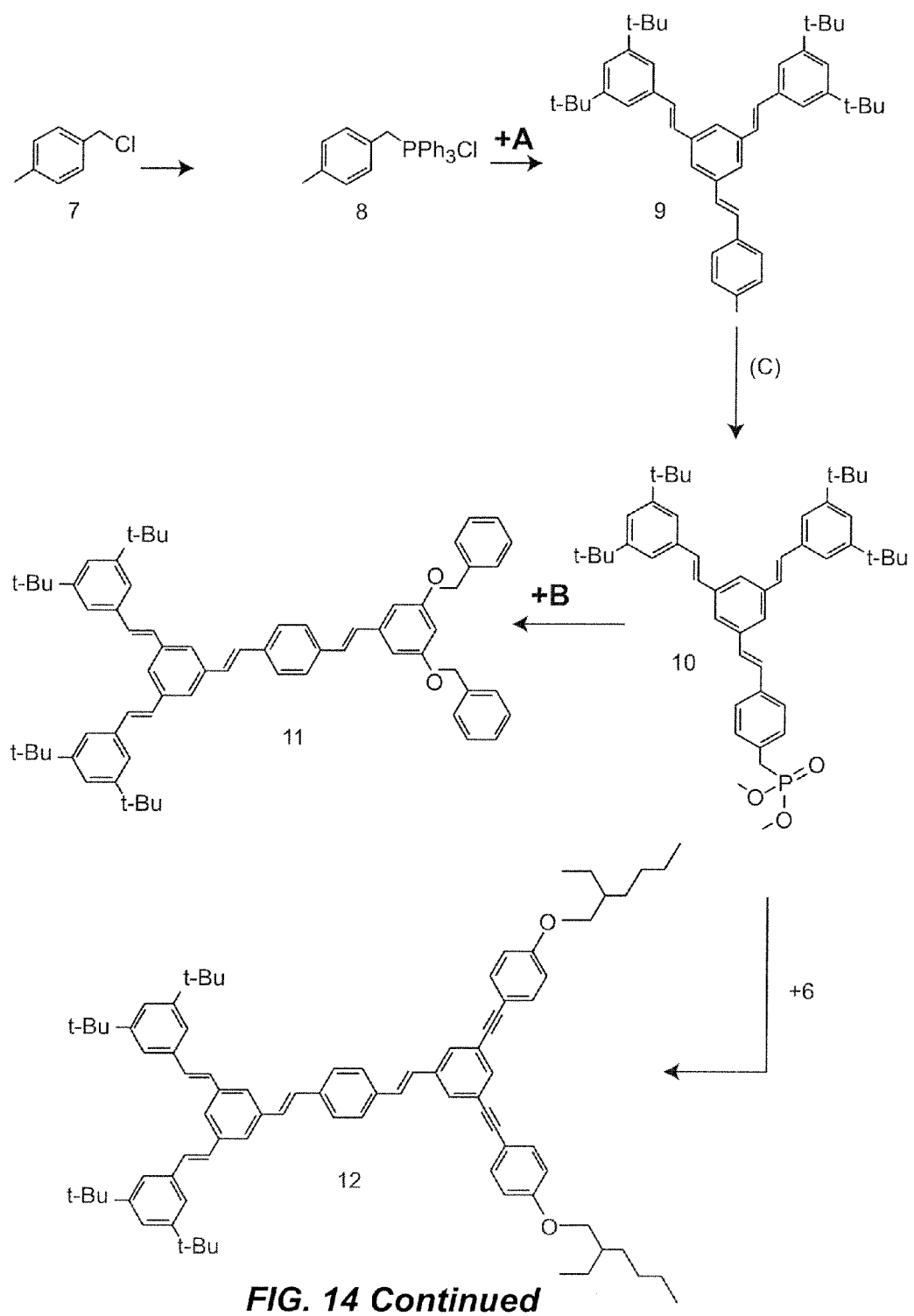

Distyrylbenzene cored dendrimers containing alkene and acetylene linked dendrons and alkene linked and ether linked dendrons and the process for making them are set out in FIG. 14; the numbers apply accordingly.

4-(2-Ethylhexyloxy)iodobenzene (2)

A suspension of potassium hydroxide (11.0 g, 196 mmol) in dimethyl sulphoxide (70 mL) was degassed under high vacuum for 10 minutes. 4-Iodophenol (1) (10.0 g, 45.5 mmol) and 2-ethylhexyl bromide (16.2 mL, 90.9 mmol) were added and the solution stirred at room temperature under argon for 65 h. The resultant suspension was poured into ice-water (150 mL) and the slurry extracted with light petroleum (2×100 mL). The organic extracts were combined, washed with brine (100 mL), dried over anhydrous magnesium sulphate, filtered and the solvent removed. The residue was purified by column chromatography over silica with light petroleum as eluent to give 4-(2-ethylhexyloxy)iodobenzene (2) (14.2 g, 94%) as a clear, colourless oil which had the same 1H and 13C nmr spectra as reported in the literature. [see A. R. A. Palmans, M. Elgin and A. Montalli, *Chem. Mater.*, 2000, 12(2), 472-480]

[4-(2-Ethylhexyloxy)phenylethynyl]trimethylsilane (3)

Tetrakis(triphenylphosphine)palladium(0) (0.52 g, 0.45 mmol) was added to a degassed suspension of trimethylsilyl acetylene (3.00 mL, 2.09 g, 21.2 mmol), 4-(2-ethylhexyloxy) iodobenzene (2) (4.27 g, 12.9 mmol) and copper (I) iodide (294 mg, 1.54 mmol) in tetrahydrofuran (20 mL) and triethylamine (30 mL). The mixture was stirred under argon at room temperature for 64.5 h. The solution was filtered through a short plug of silica with dichloromethane as eluent and the solvent removed. The residue was purified by column chromatography over silica with light petroleum as eluent to leave [4-(2-ethylhexyloxy)phenylethynyl]trimethylsilane (3) (2.93 mg, 75%) as a clear, colourless oil. (Found: C, 75.35; H, 9.85. C19H30OSi requires C, 75.43; H, 10.0%); $v_{max}$(film)/cm$^{-1}$ 2156 (C≡C); $\delta_H$(400 MHz, CDCl$_3$) 0.25 (9 H, s, SiMe$_3$), 0.92 (6 H, m, CH3), 1.30-1.51 (8 H, m, CHCH$_2$CH$_2$CH$_2$CH$_3$ and CHCH$_2$CH$_3$) 1.72 (1 H, m, OCH$_2$CH), 3.84 (2 H, d, J 5, OCH$_2$CH) and 6.82 and 7.40 (4 H, AA'BB', phenyl H); $\delta_c$(100.6 MHz, CDCl$_3$) 0.1, 11.1, 14.1, 23.0, 23.8, 29.0, 30.4, 39.3, 70.5, 92.2, 105.3, 114.3, 114.8, 133.4 and 159.6.

1-(2-Ethylhexyloxy)-4-ethynylbenzene (4)

Tetrabutylammonium fluoride (1.0 M in tetrahydrofuran, 13.2 mL, 13.2 mmol) was added to a stirred solution of [4-(2-ethylhexyloxy)phenylethynyl]trimethylsilane (3) (2.59 g, 13.2 mmol) in tetrahydrofuran (70 mL) and the solution stirred under nitrogen at room temperature for 100 min. The solvent was removed and the residue passed through a plug of silica with dichloromethane-light petroleum (1:9) as eluent to give 1-(2-ethylhexyloxy)-4-ethynylbenzene (4) (1.96 g, 99%) as a pale yellow-brown oil. (Found: C, 83.4; H, 9.85; C$_{19}$H30OSi requires C, 83.4; H, 9.6%); $v_{max}$(film)/cm$^{-1}$ 3294 and 3317 (C≡C—H) and 2107 (C≡C); $\delta_H$(400 MHz, CDCl$_3$) 0.94 (6 H, m, CH$_3$), 1.28-1.57 (8 H, m, CHCH$_2$CH$_2$CH$_2$CH$_3$ and CHCH$_2$CH$_3$), 1.74 (1 H, m, OCH$_2$CH), 3.01 (1 H, s, CCH), 3.85 (2 H, d, J 5, OCH$_2$CH), and 6.85 and 7.43 (4 H, AA'BB', phenyl H); $\delta_H$(100.6 MHz, CDCl3) 11.1, 14.1, 23.0, 23.8, 29.0, 30.4, 39.3, 70.5, 75.6, 83.8, 113.7, 114.4, 133.5, 159.8.

3,5-Bis[4-(2-ethylhexyloxy)phenylethynyl]benzaldehyde (6)

Nitrogen was bubbled through a solution of 1-(2-Ethylhexyloxy)-4-ethynylbenzene (4) (1.69 g, 7.34 mmol) and 3,5-dibromobenzaldehyde (5) (692 mg, 2.62 mmol) in tetrahydrofuran (33 mL) and triethylamine (50 mL) for 5 min. Tetrakis(triphenylphosphine)palladium(0) (218 mg, 0.189 mmol) and copper(I) iodide (65 mg, 0.34 mmol) were added and nitrogen bubbled through the solution for a further 5 min, before stirring at 70° C. for 23 h. Once cool, the solvent was removed and the residue purified by column chromatography over silica with dichloromethane-light petroleum (1:2 to 1:1) as eluent to leave 3,5-bis[4-(2-ethylhexyloxy)phenylethynyl] benzaldehyde (6) (1.17 g, 79%) as a pale brown oil. (Found: C, 83.3; H, 8.2; C$_{39}$H$_{46}$O$_3$ requires C, 83.2; H, 8.2%); $v_{max}$(film)/cm$^{-1}$ 2211 (C≡C) and 1704 (C=O); $\delta_H$(400 MHz, CDCl$_3$) 0.93-0.99 (12 H, m, CH$_3$), 1.28-1.56 (16 H, m, CHCH$_2$CH$_2$CH$_2$CH$_3$ and CHCH$_2$CH$_3$), 1.75 (2 H, m, OCH$_2$CH), 3.87 (4 H, d, J 6, OCH$_2$CH), 6.90 (4 H, AA'BB'), 7.48 (4 H, AA'BB'), 7.87 (1 H, dd, J 1.5, 4-H), 7.92 (2 H, d, J 1.5, 2, 6-H) and 10.00 (1 H, s, CHO); δ$_c$(100.6 MHz, CDCl$_3$) 11.1, 14.1, 23.1, 23.8, 29.0, 30.4, 39.3, 70.6, 86.0, 91.7, 114.1, 114.6, 125.2, 131.3, 133.5, 136.6, 139.1, 159.9 and 191.0.

4-Methylbenzylphosphonium chloride (8)

A solution of triphenylphosphine (25.24 g, 96.22 mmol) and 4-methylbenzyl chloride (7) (15.0 g, 0.107 mol) in toluene (100 mL) was stirred at 110° C. for 28 h and allowed to cool. The resultant precipitate was collected, washed with toluene and hexane then dried under vacuum to leave 4-methylbenzylphosphonium chloride (8) (27.64 g, 64%) as a white solid. δ$_H$(200 MHz, CDCl3) 2.20 (3 H, d, CH$_3$), 5.30 (2 H, d, CH$_2$P), 6.89 (4 H, AA'BB') and 7.53-7.80 (15 H, m, Ph).

4-({3,5-Bis[(3,5-di-tert-butylphenyl)vinyl]phenyl}vinyl)toluene (9)

Lithium ethoxide (1.0 M in ethanol, 15.0 mL, 15 mmol) was added to a stirred suspension of 3,5-bis[(3,5-di-tert-butylphenyl)vinyl]benzaldehyde (A) (WO99/9921935) (4.00 g, 7.48 mmol) and 4-methylbenzylphosphoniumchloride (8) (3.62 g, 8.98 mmol) in diethyl ether (40 mL), giving a clear orange solution which was stirred at room temperature for 2 h. The solution was washed with water (3×40 mL) and brine (40 mL), dried over anhydrous magnesium sulphate, filtered and the solvent removed. This residue was passed through a plug of silica with dichloromethane-light petroleum (1:4) as eluent to give a white solid, which was found by $^1$H NMR to be mainly cis isomer. The solid was heated with iodine (210 mg) and toluene (100 mL) at 100° C. under argon for 6 h and allowed to cool. The solution was washed with saturated aqueous sodium metabisulphite (50 mL) and brine (50 mL) and the solvent removed. The residue was recrystallised from a dichloromethane-hexanes mixture to leave 4-({3,5-bis[(3,5-di-tert-butylphenyl)vinyl]phenyl}vinyl)toluene (9) (3.00 g, 64%) as a white solid. δ$_H$(400 MHz, CDCl$_3$) 1.40 (36 H, s, t-butyl), 2.39 (3 H, s, CH$_3$), 7.13 and 7.22 (2 H, d, J 16, core vinyl H), 7.17 and 7.28 (4 H, d, J 16, branch vinyl H), 7.21 and 7.48 (4 H, AA'BB', core phenyl H), 7.39 (2 H, dd, J 1.5, sp H), 7.43 (4 H, d, J 1.5, sp H), 7.59 (2 H, d, J 1, bp H) and 7.62 (1 H, s, bp H).

4-({3,5-Bis[(3,5-di-tert-butylphenyl)vinyl]phenyl}vinyl)benzylphosphonic acid dimethyl ester (10)

A mixture of 4-({3,5-bis[(3,5-di-tert-butylphenyl)vinyl]phenyl}vinyl)toluene (9) (2.06 g, 3.30 mmol), N-bromosuccinimide (0.587 g, 3.30 mmol), AIBN (10 mg, 0.61 mmol) and chloroform (10 ml) was heated to reflux for 3.5 h and allowed to cool. The suspension was filtered through a plug of silica with dichloromethane as eluent and the solvent removed to leave a white solid which was a mixture of unreacted 4-({3,5-bis[(3,5-di-tert-butylphenyl)vinyl]phenyl}-vinyl)toluene (9) and 4-({3,5-bis[(3,5-di-tert-butylphenyl)vinyl]-phenyl}vinyl)benzyl bromide. Trimethylphosophite (13.0 mL, 0.110 mol) was added and the solution heated to 110° C. for 18 h. Excess trimethylphosphite was removed by distillation under reduced pressure. The residue was purified by column chromatography over silica with dichloromethane-ethyl acetate (1:0 to 0:1) as eluent, then recrystallisation from a dichloromethane-methanol mixture gave 4-({3,5-bis[(3,5-di-tert-butylphenyl)vinyl]phenyl}vinyl)benzylphosphonic acid dimethyl ester (10) (723 mg, 30%) as a white solid. δ$_H$(400 MHz, CDCl3) 1.39 (36 H, s, t-butyl), 3.21 (2 H, d, J 22, CH$_2$P), 3.71 (6 H, d, J 11, OCH$_3$), 7.155 and 7.21 (2 H, d, J 16, core vinyl H), 7.164 and 7.27 (4 H, d, J 16, branch vinyl H), 7.33 (2 H, m, AA'BB', core phenyl H), 7.39 (2 H, dd, J 1.5, sp H), 7.43 (4 H, d, J 1.5, sp H), 7.53 (2 H, m, AA'BB', core phenyl H), 7.58 (2 H, d, J 1.5, bp H), and 7.63 (1 H, s, bp H); m/z (APCI$^+$) 730.9 (MH$^+$, 100%).

1-{[3,5-bis(benzyloxy)phenyl]vinyl}-4-({3,5-bis[(3,5-di-tert-butylphenyl)vinyl]phenyl}-vinyl)benzene (11)

A solution of 3,5-bis(benzyloxy)benzaldehyde (B) (87.1 mg, 2.74 mmol), 4-({3,5-bis[(3,5-di-tert-butylphenyl)vinyl]phenyl}vinyl)benzylphosphonic acid dimethyl ester (10) (200 mg, 2.74 mmol) and potassium tert-butoxide (36.8 mg, 3.28 mmol) in tetrahydrofuran (4 mL) was stirred at room temperature in the dark for 20.75 h. The solution turned red-orange and acquired blue fluorescence. Ether (20 mL) was added and the solution washed with water (20 mL) and brine (20 mL), dried over anhydrous magnesium sulphate, filtered and the solvent removed. The residue was purified by column chromatography over silica with dichloromethane-light petroleum as eluent to leave 1-{[3,5-bis(benzyloxy)phenyl]vinyl}-4-({3,5-bis[(3,5-di-tert-butylphenyl)vinyl]phenyl}-vinyl)benzene (11) (194 mg, 77%) as a beige solid. δ$_H$(400 MHz, CDCl$_3$) 1.42 (36 H, s, t-butyl), 6.60 (1 H, dd, J 2, phenoxy bp-H), 6.83 (2 H, d, J 2, phenoxy bp-H), 7.10 (2 H, s, core vinyl H), 7.18-7.34 (6 H, m, vinylic H), 7.34-7.66 (23 H, m, phenyl H).

1-({3,5-Bis[(3,5-di-tert-butylphenyl)vinyl]phenyl}vinyl)-4-[(3,5-bis{[4-(2-ethylhexyloxy)phenyl]ethynyl}phenyl)vinyl]benzene (12)

Potassium tert-butoxide (36.8 mg, 3.28 mmol) was added to a solution of 3,5-bis[4-(2-ethylhexyloxy)phenylethynyl]benzaldehyde (6) (153 mg, 2.74 mmol) and 4-({3,5-bis[(3,5-di-tert-butylphenyl)vinyl]phenyl}vinyl)benzylphosphonic acid dimethyl ester (10) (200 mg, 2.74 mmol) in tetrahydrofuran (4 mL) and the mixture stirred at room temperature in the dark for 19 h. The solution turned red-orange and acquired blue fluorescence. Ether (20 mL) was added and the solution washed with water (5 mL) and brine (5 mL), dried over anhydrous magnesium sulphate, filtered and the solvent removed. The residue was purified by column chromatography over silica with dichloromethane-light petroleum as eluent to leave 1-({3,5-bis[(3,5-di-tert-butylphenyl)vinyl]phenyl}vinyl)-4-[(3,5-bis{[4-(2-ethylhexyloxy)-phenyl]ethynyl}phenyl)vinyl]benzene (12) (241 mg, 76%) as a yellow solid. δ$_H$(400 MHz, CDCl$_3$) 0.95 (12 H, m, CH$_3$), 1.41-1.60 (16 H, m, CHCH$_2$CH$_2$CH$_2$CH$_3$ and CHCH$_2$CH$_3$), 1.42 (36 H, s, t-butyl), 1.78 (2 H, m, OCH$_2$CH), 3.89 (4 H, d, J 6, OCH$_2$CH), 6.93 (4 H, AA'BB', phenoxy sp-H), 7.12-7.34 (8 H, m, vinylic H), 7.43 (2 H, dd, J 1.5, sp-H), 7.48 (4 H, d, J 1.5, sp-H) and 7.51-7.67 (10 H, m, DSB phenyl H).

Example 12

Devices for the structure (ITO/PEDOT/dendrimer/LiF/Ca/Al) were prepared by the following general procedure:—
1. Etch ITO squares 12×12 mm into 4×12 mm ITO strip by acid etch.
2. Acetone rinse for 10 minutes with ultrasonication.

3. Propan-2-ol rinse for 10 minutes with ultrasonication.
4. Substrates dry under nitrogen flow.
5. Substrates subject to oxygen plasma treatment for 5 minutes at 100 W.
6. PEDOT spun from water solution at 2500 rpm for 1 minute.
7. PEDOT layer dried in air at 85° C. for 5 minutes.
8. Dendrimer film deposited by spin coating from tetrahydrofuran at 2000 rpm giving film thicknesses of around 80-90 nm.
9. Substrates placed in vacuum evaporator.
10. LiF followed by Ca followed by Al deposited under vacuum.

The following device results were obtained:

Compound 8 of Example 10:
  CIE co-ordinates (0.22, 0.29); external quantum efficiency=0.18 at 10V.
Compound 11 of Example 11:
  CIE co-ordinates (0.38, 0.47); external quantum efficiency=0.06 at 30V.
Compound 12 of Example 11:
  CIE co-ordinates (0.30; 0.35); external quantum efficiency=0.02 at 15V.

The invention claimed is:

1. A light emitting dendrimer having the formula:

CORE-[DENDRITE$^1$]$_n$[DENDRITE$^2$]$_m$ in which CORE represents an atom or group, n and m, which may be the same or different, each represent an integer of at least 1, each DENDRITE$^1$, which may be the same or different when n is greater than 1, and each DENDRITE$^2$, which may be the same or different when no is greater than 1, represent dendritic structures, at least one of said structures being fully conjugated and comprising aryl and/or heteroaryl groups and, optionally, vinyl and/or acetylenyl groups, connected via sp$^2$ or sp hybridized carbon atoms of said aryl, heteroaryl, vinyl and acetylenyl groups, and at least one branching point and/or link between branching points in DENDRITE$^1$ being different from those in DENDRITE$^2$, CORE terminating in the single bond which is connected to a sp$^2$ hybridized (ring) carbon atom of the first (hetero)aryl group to which more than one conjugated dendritic branch is attached, said ring carbon atom forming part of said fully conjugated DENDRITE$^1$ or DENDRITE$^2$ and CORE terminating at the single bond to the first branching point for the other of said DENDRITE$^1$ or DENDRITE$^2$, at least one of the CORE, DENDRITE$^1$ and DENDRITE$^2$ being luminescent, wherein the dendrimer is luminescent in the solid state.

2. A dendrimer according to claim 1, wherein the CORE is luminescent.

3. A dendrimer according to claim 1, wherein at least one component of the dendritic structures is luminescent.

4. A dendrimer according to claim 1, wherein the HOMO-LUMO energy gap of the CORE is lower than that of the conjugated moieties in the dendritic structures.

5. A dendrimer according to claim 1, wherein the HOMO-LUMO energy gap of the moieties in the dendritic structures generally decreases from the surface to the point of attachment to the core.

6. A light emitting device comprising a layer of a dendrimer according to claim 1.

7. A light emitting device according to claim 6, further comprising at least one of a hole-transporting layer and an electron-transporting layer.

8. A light emitting device according to claim 6, wherein the layer comprising the dendrimer further includes another material.

9. A light emitting device according to claim 8, wherein said material is an organic material.

10. A light emitting device according to claim 6, which is a light emitting diode (LED).

11. A dendrimer according to claim 1, wherein DENDRITE$^1$ comprises a branching point between branching points which is different from those in DENDRITE$^2$.

12. A dendrimer according to claim 1, wherein DENDRITE$^1$ comprises a link between branching points which is different from those in DENDRITE$^2$.

13. A light emitting dendrimer having the formula:

CORE-[DENDRITE]$_n$ in which CORE represents an atom or group, n represents an integer of at least 1, each DENDRITE, which may be the same or different, represents an inherently at least partially conjugated dendritic molecular structure which comprises aryl and/or heteroaryl and, optionally, vinyl and/or acetylenyl groups, connected via sp$^2$ or sp hybridized carbon atoms of said aryl, heteroaryl, vinyl and acetylenyl groups, and wherein the links between at least one pair of adjacent branching points in said DENDRITE are different such that if two links are to be regarded as different then one said link must comprise at least one aryl, heteroaryl, vinyl or acetylenyl group which is not present in the other of said two links, CORE terminating in the single bond which is connected to a sp$^2$ hybridized (ring) carbon atom of the first (hetero)aryl group to which more than one dendritic branch is attached, said ring carbon atom forming part of said DENDRITE, at least one of the CORE and the DENDRITE being luminescent, wherein the dendrimer is luminescent in the solid state.

14. A dendrimer according to claim 13, wherein the CORE is luminescent.

15. A dendrimer according to claim 13, wherein at least one component of the dendritic structures is luminescent.

16. A dendrimer according to claim 13, wherein the HOMO-LUMO energy gap of the CORE is lower than that of the conjugated moieties in the dendritic structures.

17. A dendrimer according to claim 13, wherein the HOMO-LUMO energy gap of the moieties in the dendritic structures generally decreases from the surface to the point of attachment to the core.

18. A light emitting device comprising a layer of a dendrimer according to claim 13.

19. A light emitting device according to claim 18, further comprising at least one of a hole-transporting layer and an electron-transporting layer.

20. A light emitting device according to claim 18, wherein the layer comprising the dendrimer further includes another material.

21. A light emitting device according to claim 20, wherein said material is an organic material.

22. A light emitting device according to claim 18, which is a light emitting diode (LED).

* * * * *

UNITED STATES PATENT AND TRADEMARK OFFICE
CERTIFICATE OF CORRECTION

PATENT NO. : 7,960,557 B2
APPLICATION NO. : 12/472176
DATED : June 14, 2011
INVENTOR(S) : Paul Leslie Burn et al.

Page 1 of 1

It is certified that error appears in the above-identified patent and that said Letters Patent is hereby corrected as shown below:

In the Claims:

At Column 17, line 33, "no" should be -- m --.

Signed and Sealed this
Seventeenth Day of June, 2014

Michelle K. Lee
*Deputy Director of the United States Patent and Trademark Office*